(12) United States Patent
Humphries et al.

(10) Patent No.: US 10,403,823 B2
(45) Date of Patent: Sep. 3, 2019

(54) POLYMER AND ORGANIC LIGHT EMITTING DEVICE

(71) Applicants: Cambridge Display Technology Limited, Godmanchester (GB); Sumitomo Chemical Company Limited, Tokyo (JP)

(72) Inventors: Martin Humphries, Godmanchester (GB); Simon Foxon, Godmanchester (GB)

(73) Assignees: Cambridge Display Technology Limited, Godmanchester (GB); Sumitomo Chemical Company Limited, Tokyo (JP)

( * ) Notice: Subject to any disclaimer, the term of this patent is extended or adjusted under 35 U.S.C. 154(b) by 340 days.

(21) Appl. No.: 15/024,986

(22) PCT Filed: Sep. 23, 2014

(86) PCT No.: PCT/GB2014/052893
§ 371 (c)(1),
(2) Date: Mar. 25, 2016

(87) PCT Pub. No.: WO2015/044656
PCT Pub. Date: Apr. 2, 2015

(65) Prior Publication Data
US 2016/0218291 A1    Jul. 28, 2016

(30) Foreign Application Priority Data
Sep. 25, 2013 (GB) .................. 1317028.7

(51) Int. Cl.
*H01L 51/00* (2006.01)
*C09K 11/06* (2006.01)
(Continued)

(52) U.S. Cl.
CPC ........ *H01L 51/0043* (2013.01); *C08G 61/122* (2013.01); *C09K 11/06* (2013.01);
(Continued)

(58) Field of Classification Search
None
See application file for complete search history.

(56) References Cited

U.S. PATENT DOCUMENTS

2002/0028347 A1* 3/2002 Marrocco, III ........ C08G 61/10
428/690
2006/0115678 A1* 6/2006 Saitoh ................... C07C 211/54
428/690
(Continued)

FOREIGN PATENT DOCUMENTS

CN  101775122 A  7/2010
WO  WO 2005/013386 A2  2/2005
(Continued)

OTHER PUBLICATIONS

Schulz et al. "Enhancement of Phosphorescence of Ir Complexes Bound to Conjugated Polymers: Increasing the Triplet Level of the Main Chain" Macromolecules 2006, 39, 9157-9165 (Year: 2006).*
(Continued)

*Primary Examiner* — Magali P Slawski
(74) *Attorney, Agent, or Firm* — Wolf, Greenfield & Sacks, P.C.

(57) ABSTRACT

Polymer and Organic Light Emitting Device A polymer comprising a repeat unit of formula (I a), (I b) or (Ic): (Formulae (Ia), (Ib), (Ic)) wherein M is a metal; R is a backbone repeat group; n is 1 or 2; Sp is a spacer group; w is 0 or 1; $L^1$ and $L^2$ are mono- or bidentate co-coordinating groups; ---- represents a second metal to ligand bond in the case where $L^1$ or $L^2$ is a bidentate ligand and at least one of
(Continued)

$L^1$ and $L^2$ is substituted with group of formula (II) (Formula (II)) wherein m is 0 or 1; each $Ar^1$, $Ar^2$ and $Ar^3$ is aryl or heteroaryl. The polymer may be used as an emissive material in an organic light-emitting device.

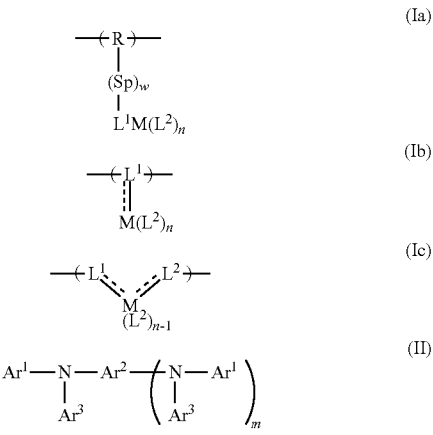

21 Claims, 6 Drawing Sheets

(51) Int. Cl.
C08G 61/12 (2006.01)
H01L 51/50 (2006.01)
H01L 51/56 (2006.01)

(52) U.S. Cl.
CPC ...... *H01L 51/0035* (2013.01); *H01L 51/0039* (2013.01); *H01L 51/0085* (2013.01); *C08G 2261/12* (2013.01); *C08G 2261/312* (2013.01); *C08G 2261/314* (2013.01); *C08G 2261/3142* (2013.01); *C08G 2261/3162* (2013.01); *C08G 2261/3221* (2013.01); *C08G 2261/364* (2013.01); *C08G 2261/374* (2013.01); *C08G 2261/411* (2013.01); *C08G 2261/524* (2013.01); *C08G 2261/95* (2013.01); *C09K 2211/1011* (2013.01); *C09K 2211/1014* (2013.01); *C09K 2211/1022* (2013.01); *C09K 2211/1029* (2013.01); *C09K 2211/1044* (2013.01); *C09K 2211/1416* (2013.01); *C09K 2211/1425* (2013.01); *C09K 2211/1433* (2013.01); *C09K 2211/1466* (2013.01); *C09K 2211/185* (2013.01); *H01L 51/0003* (2013.01); *H01L 51/5016* (2013.01); *H01L 51/56* (2013.01)

(56) References Cited

U.S. PATENT DOCUMENTS

| 2006/0134463 A1* | 6/2006 | Hwang | C07C 211/54 428/690 |
| 2007/0167588 A1 | 7/2007 | Kato et al. | |
| 2008/0280163 A1 | 11/2008 | Kwong et al. | |
| 2012/0107989 A1 | 5/2012 | Xia et al. | |

FOREIGN PATENT DOCUMENTS

| WO | WO 2006/129471 A1 | 12/2006 |
| WO | WO 2008/073440 A2 | 6/2008 |
| WO | WO 2013/005028 A1 | 1/2013 |
| WO | WO 2013/021180 A1 | 2/2013 |
| WO | WO 2013/093400 A1 | 6/2013 |

OTHER PUBLICATIONS

Hohenleutner et al. ("Rapid Combinatorial Synthesis and Chromatography Based Screening of Phosphorescent Iridium Complexes for Solution Processing" Adv. Funct. Mater. 2012, 22, 3406-3413 (Year: 2012).*
Combined Search and Examination Report dated May 1, 2014 for Application No. GB 1317028.7.
International Search Report and Written Opinion dated Nov. 27, 2014 for Application No. PCT/GB2014/052893.
International Preliminary Report on Patentability dated Apr. 7, 2016 for Application No. PCT/GB2014/052893.
Suzuki et al., Highly efficient polymer light-emitting devices using ambipolar phosphorescent polymers. Appl Phys Lett. Mar. 3, 2005;86(10):103507.1-3.

* cited by examiner

POLYMER AND ORGANIC LIGHT EMITTING DEVICE

RELATED APPLICATIONS

The present application is a national stage filing under 35 U.S.C. § 371 of international PCT application, PCT/GB2014/052893, filed Sep. 23, 2014, which claims priority to United Kingdom patent application, GB 1317028.7, filed Sep. 25, 2013, each of which is incorporated herein by reference in its entirety.

FIELD OF THE INVENTION

The present invention relates to light-emitting materials and devices. More particularly the present invention relates to phosphorescent light-emitting polymer materials, formulations and light-emitting devices comprising said light-emitting polymers and methods of making said light-emitting devices.

BACKGROUND

Electronic devices comprising active organic materials are attracting increasing attention for use in devices such as organic light emitting diodes (OLEDs), organic photoresponsive devices (in particular organic photovoltaic devices and organic photosensors), organic transistors and memory array devices. Devices comprising organic materials offer benefits such as low weight, low power consumption and flexibility. Moreover, use of soluble organic materials allows use of solution processing in device manufacture, for example inkjet printing or spin-coating.

An OLED may comprise a substrate carrying an anode, a cathode and one or more organic light-emitting layers between the anode and cathode.

Holes are injected into the device through the anode and electrons are injected through the cathode during operation of the device. Holes in the highest occupied molecular orbital (HOMO) and electrons in the lowest unoccupied molecular orbital (LUMO) of a light-emitting material combine to form an exciton that releases its energy as light.

Within an OLED device, the light-emitting material may be used as a dopant within a light emitting layer. The light-emitting layer may comprise a semiconducting host material and the light-emitting dopant, and energy will be transferred from the host material to the light-emitting dopant. For example, J. Appl. Phys. 65, 3610, 1989 discloses a host material doped with a fluorescent light-emitting dopant (that is, a light-emitting material in which light is emitted via decay of a singlet exciton) and Appl. Phys. Lett., 2000, 77, 904 discloses a host material doped with a phosphorescent light emitting dopant (that is, a light-emitting material in which light is emitted via decay of a triplet exciton).

Emission from more than one layer of an OLED, in particular to achieve white light emission, is disclosed in, for example, WO 2008/131750, DE 102007020644 and EP1390962 and SPIE (2004), 5519, 42-47.

Suitable light-emitting materials include small molecule, polymeric and dendrimeric materials. Suitable light-emitting polymers include poly(arylene vinylenes) such as poly(p-phenylene vinylenes) and polyarylenes such as polyfluorenes.

WO 2011/064355 discloses a metal complex substituted with an organic charge-transporting group for transporting holes or electrons and for improving solubility of the complex in an organic solvent.

WO 2005/013386 discloses an electroluminescent device comprising a polymeric host containing certain triarylamine repeat units and a phosphorescent metal complex.

It is an object of the present invention to provide phosphorescent light-emitting materials which have an improved efficiency of emission and increased lifetime when used in devices containing one or more light-emitting layers.

SUMMARY OF THE INVENTION

In a first aspect the invention provides a polymer comprising a repeat unit of formula (I a), (I b) or (Ic):

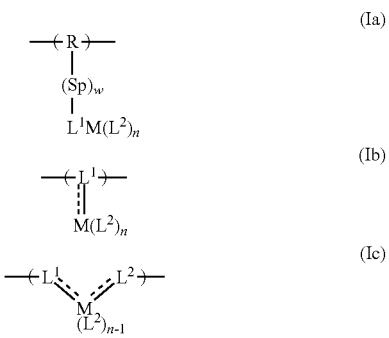

wherein:
M is a metal;
R is a backbone repeat group;
n is 1 or 2;
Sp is a spacer group;
w is 0 or 1;
$L^1$ is a mono- or bidentate co-coordinating group;
$L^2$ which may be the same or different in each occurrence, is a mono- or bidentate coordinating group;
---- represents a second metal to ligand bond in the case where $L^1$ or $L^2$ is a bidentate ligand and
at least one of $L^1$ and $L^2$ is substituted with group of formula (II)

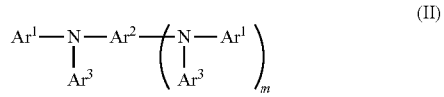

wherein m is 0 or 1;
each $Ar^1$, $Ar^2$ and $Ar^3$ is independently in each occurrence selected from an aryl or heteroaryl that may be unsubstituted or substituted with one or more substituents, and any two of $Ar^1$, $Ar^2$ and $Ar^3$ linked to the same N atom may be linked by a direct bond or a divalent linking group.

In a second aspect the invention provides a formulation comprising a polymer according to the first aspect and at least one solvent.

In a third aspect the invention provides an organic light-emitting device comprising an anode, a cathode and a light-emitting layer between the anode and the cathode, wherein the light-emitting layer comprises a polymer according to the first aspect.

In a fourth aspect the invention provides a method of forming the organic light-emitting device of the third aspect, the method comprising the step of forming the light-emitting layer over one of the anode or cathode, and forming the other of the anode or cathode over the light-emitting layer.

DESCRIPTION OF THE DRAWINGS

The invention will now be described in more detail, with reference to the accompanying figures in which.

DETAILED DESCRIPTION OF THE INVENTION

Figure 1A:
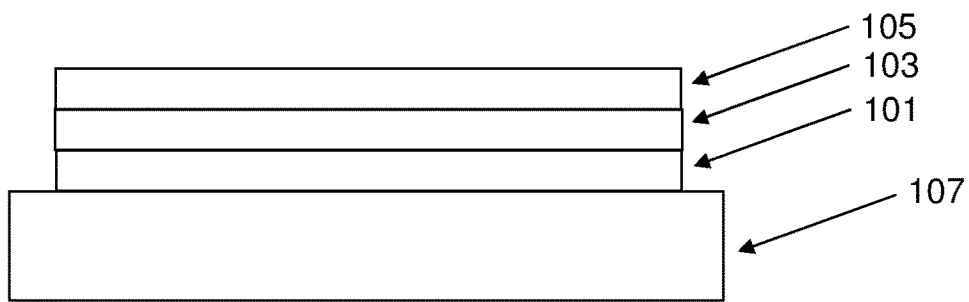
FIG. 1A illustrates schematically an OLED according to the invention.

FIG. 1A, which is not drawn to any scale, illustrates schematically an OLED according to an embodiment of the invention. The OLED is carried on substrate 107 and comprises an anode 101, a cathode 105 and a light emitting layer 103 between the anode and the cathode. Light-emitting layer 103 comprises the phosphorescent light-emitting polymer of the invention.

In operation, holes injected from the anode and electrons injected from the cathode combine in the light-emitting layer to form excitons.

With reference to FIG. 1A, further layers may be provided between the anode and the cathode including, without limitation, charge-transporting layers, charge-blocking layers and charge injection layers. The device may contain more than one light-emitting layer.

Exemplary OLED structures including one or more further layers include the following:

Anode/Hole-injection layer/Light-emitting layer/Cathode;

Anode/Hole transporting layer/Light-emitting layer/Cathode;

Anode/Hole-injection layer/Hole-transporting layer/Light-emitting layer/Cathode;

Anode/Hole-injection layer/Hole-transporting layer/Light-emitting layer/Electron-transporting layer/Cathode.

In one preferred embodiment, the OLED comprises at least one, optionally both, of a hole injection layer and a hole transporting layer.

Substantially all emission from a device may be from a material of the invention in the light-emitting layer of the device. In other embodiments, one or more further light-emitting materials may be provided in the device. Further light-emitting materials may be provided in the same layer as the light-emitting layer containing the polymer of the invention, or may be provided in one or more further light-emitting layers. The further light-emitting materials may be selected from fluorescent or phosphorescent light-emitting materials having a colour of emission differing from or the same as that of the polymer material of the invention.

Figure 1B:
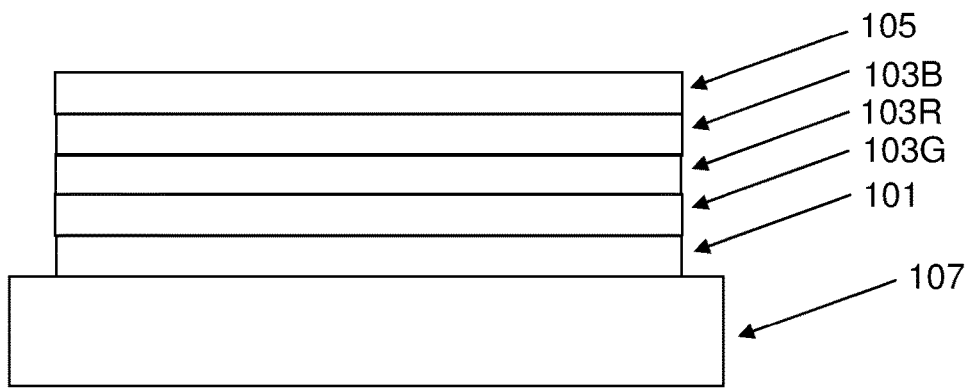
FIG. 1B illustrates schematically an OLED according to an embodiment of the invention.

FIG. 1B, which is not drawn to any scale, illustrates schematically an OLED according to another embodiment of the invention. The OLED is carried on substrate 107 and comprises an anode 101, a cathode 105 and three light emitting layers 103G, 103R and 103B between the anode and the cathode. Green light-emitting layer 103G comprises a phosphorescent light-emitting material of the invention, light-emitting layer 103R comprises a red light-emitting material, and light-emitting layer 103B comprises a blue light-emitting material.

In operation, holes injected from the anode and electrons injected from the cathode combine in at least the first light-emitting layer 103G and the third light-emitting layer 103B to form excitons.

Light-emitting layer 103G may further be provided with more than one light-emitting dopant, for example a blue and/or a red light-emitting dopant.

Light emission from layer 103R may occur by a mechanism similar to that described above with reference to emission from layer 103G. In addition to, or as an alternative to, recombination of holes and electrons to form excitons in light emitting layer 103R, triplet excitons may migrate from layer 103G and/or layer 103B into layer 103R where they may be absorbed by the red phosphorescent dopant.

Light emitted from each of these three layers may combine to provide white light.

Highest occupied molecular orbital (HOMO) levels of the components of layers 103G, 103R and 103B may be selected by appropriate choice of host and/or dopants in order that holes injected from the anode may efficiently reach the light-emitting layer 103B. Likewise, the lowest unoccupied molecular orbital (LUMO) levels of these components may be selected in order that electrons injected from the cathode may efficiently reach the light-emitting layer 103G.

The HOMO level of the host and/or dopant of layer 103R is optionally no more than 0.5 eV, optionally no more than 0.3 eV, deeper (further from vacuum level) than the HOMO level of layer 103G and/or layer 103B. This may at least partially prevent trapping of holes at layer 103R.

The LUMO level of the host and/or dopant of layer 103R is optionally no more than 1.0 eV, optionally no more than 0.5 eV, optionally no more than 0.3 eV, shallower (closer to vacuum level) than the LUMO level of layer 103G and/or layer 103B. This may at least partially prevent trapping of electrons at layer 103R.

HOMO and LUMO levels may be measured by cyclic voltammetry.

Phosphorescent Polymer

In a first aspect the invention provides a phosphorescent polymer comprising a repeat unit of formula (I a), (I b) or (Ic):

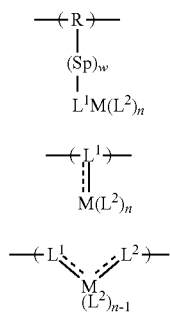

(Ia)

(Ib)

(Ic)

wherein:
M is a metal;
R is a backbone repeat group;
n is 1 or 2;
Sp is a spacer group;
w is 0 or 1;
$L^1$ is a mono- or bidentate coordinating group;
$L^2$ which may be the same or different in each occurrence, is a mono- or bidentate coordinating group;
---- represents a second metal to ligand bond in the case where $L^1$ or $L^2$ is a bidentate ligand; and
at least one of $L^1$ and $L^2$ is substituted with group of formula (II)

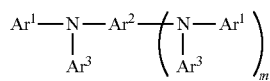

(II)

wherein:
m is 0 or 1;
each $Ar^1$, $Ar^2$ and $Ar^3$ is independently in each occurrence selected from an aryl or heteroaryl that may be unsubstituted or substituted with one or more substituents, any two of $Ar^1$, $Ar^2$ and $Ar^3$ linked to the same N atom may be linked by a direct bond or a divalent linking group.

Unless stated otherwise, "aryl" and "heteroaryl" as used anywhere herein includes monocyclic and polycyclic aromatic and heteroaromatic groups.

Exemplary metals M include transition metal elements, preferably group VIII transition metal element. Iridium is particularly preferred.

The polymer is preferably a conjugated polymer, and R preferably comprises aromatic or heteroaromatic groups conjugated to adjacent repeat units. Conjugated polymers contain repeat units in the polymer backbone that are conjugated together. The extent of conjugation of the polymer backbone may be controlled by selection of the repeat units.

In one embodiment R is —$(Ar^6)_p$— wherein p is 1, 2, or 3 and each $Ar^6$ is independently selected from aryl or heteroaryl. Optionally, p=1.

Exemplary groups $Ar^6$ include fluorene and phenylene.

If $Ar^6$ is fluorene then the repeat unit of formula (Ia) may be a group of formula (VI):

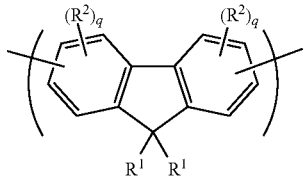

(VI)

wherein:
$R^1$ in each occurrence is the same or different and is H or a substituent and the two groups $R^1$ may be linked to form a ring;
$R^2$ in each occurrence is a substituent;
q is 0, 1, 2 or 3; and
the repeat unit of formula (VI) comprises at least one substituent $R^1$ or $R^2$ of formula -$(Sp)_w$-$L^1ML^2$, at least one of $L^1$ and $L^2$ being substituted with a group of formula (II).

Each $R^1$ is preferably a substituent, and each $R^1$ may independently be selected from the group consisting of:
alkyl, optionally $C_{1-20}$ alkyl, wherein one or more non-adjacent C atoms may be replaced with optionally substituted aryl or heteroaryl, O, S, substituted N, C=O or —COO—;
aryl or heteroaryl that may be unsubstituted or substituted with one or more substituents;
a linear or branched chain of aryl or heteroaryl groups, each of which groups may independently be substituted, for example a group of formula —$(Ar^7)_r$ wherein Ar7 in each occurrence is independently an aryl or heteroaryl group that may be unsubstituted or substituted with one or more substituents and r is at least 2, optionally 2 or 3;
a cross-linkable group, for example a group comprising a double bond such as a vinyl or acrylate group, or a benzocyclobutane group; and
a group of formula -$(Sp)_w$-$L^1ML^2$, at least one of $L^1$ and $L^2$ being substituted with a group of formula (II).

In the case where $R^1$ is an aryl or heteroaryl group, or a linear or branched chain of aryl or heteroaryl groups, the or each aryl or heteroaryl group may be unsubstituted or substituted with one or more substituents $R^3$ selected from the group consisting of:
alkyl, for example $C_{1-20}$ alkyl, wherein one or more non-adjacent C atoms may be replaced with O, S, substituted N, C=O and —COO— and one or more H atoms of the alkyl group may be replaced with F or aryl or heteroaryl optionally substituted with one or more groups $R^4$,
aryl or heteroaryl optionally substituted with one or more groups $R^4$,
$NR^5_2$, $OR^5$, $SR^5$, and
fluorine, nitro and cyano;
wherein each $R^4$ is independently alkyl, for example $C_{1-20}$ alkyl, and each $R^5$ is independently selected from the group consisting of $C_{1-20}$ alkyl and aryl or heteroaryl optionally substituted with one or more alkyl groups.

Optional substituents $R^2$ are preferably selected from the group consisting of alkyl, for example $C_{1-20}$ alkyl, wherein one or more non-adjacent C atoms may be replaced with O, S, NH or substituted N, C=O and —COO—, optionally substituted aryl, optionally substituted heteroaryl, alkoxy, alkylthio, fluorine, cyano and arylalkyl. Particularly preferred substituents include $C_{1-20}$ alkyl and substituted or unsubstituted aryl, for example phenyl. Optional substituents for the aryl include one or more $C_{1-20}$ alkyl groups.

Where present, substituted N may independently in each occurrence be $NR^6$ wherein $R^6$ is alkyl, optionally $C_{1-20}$ alkyl, or optionally substituted aryl or heteroaryl. Optional substituents for aryl or heteroaryl $R^6$ may be selected from $R^5$.

Preferably, each $R^1$ and, if present, $R^2$ is selected from the group consisting of $-(Sp)_w-L^1ML^2$ and $C_{1-40}$ hydrocarbyl. Exemplary $C_{1-40}$ hydrocarbyl groups include $C_{1-20}$ alkyl; phenyl that may be unsubstituted or substituted with one or more $C_{1-20}$ alkyl groups; and $—(Ar^7)_r$ wherein $Ar^7$ in each occurrence is phenyl that may be unsubstituted or substituted with one or more $C_{1-20}$ alkyl groups and r is 2 or 3.

In one arrangement, the repeat unit of formula (VI) may be a 2,7-linked repeat unit of formula (VIa):

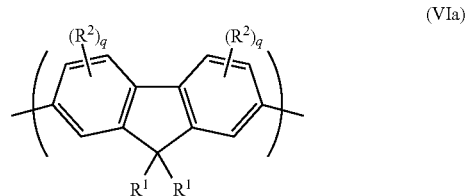

(VIa)

In another arrangement, the extent of conjugation of repeat units of formula (VI) with adjacent repeat units may be controlled by selecting the linking position of the group of formula (VI) to adjacent repeat units. For example, linking the repeat unit through the 3- and/or 6-positions may limit the extent of conjugation between repeat units adjacent to the repeat unit of formula (VI).

Alternatively or additionally, the extent of conjugation of the repeat unit of formula (VI) with an adjacent repeat unit may be limited by substituting the repeat unit of formula (VI) with one or more substituents $R^2$ in or more positions adjacent to the linking positions in order to create a twist with the adjacent repeat unit or units, for example a 2,7-linked fluorene carrying a $C_{1-20}$ alkyl substituent in one or both of the 3- and 6-positions.

If $Ar^6$ is phenylene then the repeat unit of formula (Ia) may be group of formula (VII):

(VII)

wherein v is 1, 2, 3 or 4, optionally 1 or 2; and $R^7$ independently in each occurrence is a substituent, wherein at least one $R^7$ is a group of formula $-(Sp)_w-L^1ML^2$, at least one of $L^1$ and $L^2$ being substituted with a group of formula (II).

Each $R^7$ may optionally be selected from substituents $R^1$ as described above with reference to formula (VI), for example $C_{1-20}$ alkyl, and phenyl that is unsubstituted or substituted with one or more $C_{1-20}$ alkyl groups.

The repeat unit of formula (VII) may be 1,4-linked, 1,2-linked or 1,3-linked.

If the repeat unit of formula (VII) is 1,2- or 1,3 linked, then the extent of conjugation of repeat unit of formula (VII) to one or both adjacent repeat units may be relatively low.

Optionally R is a repeat unit of formula (VIIa) substituted with at least one group $-(Sp)_w-L^1ML^2$, at least one of $L^1$ and $L^2$ being substituted with a group of formula (II), and optionally substituted with one or more further substituents $R^7$:

(VIIa)

In one embodiment each $L^1$ and $L^2$ are independently selected from ligands comprising a bidentate group forming organometallic complexes with carbon or nitrogen donors. Exemplary bidentate groups include bidentate ligands of formula (III):

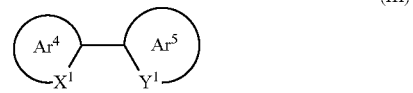

(III)

wherein $Ar^4$ and $Ar^5$ may be the same or different and are independently selected from optionally substituted aryl or heteroaryl; $X^1$ and $Y^1$ may be the same or different and are independently selected from carbon or nitrogen; and $Ar^4$ and $Ar^5$ may be fused together. Ligands wherein $X^1$ is carbon and $Y^1$ is nitrogen are particularly preferred.

$ML^1(L^2)_n$ is preferably a phosphorescent light-emitting group including, without limitation, red, green and blue phosphorescent light-emitting materials. Phosphorescent groups $ML^1(L^2)_n$ may luminesce by metal-to-ligand charge transfer (MLCT), and the identity of $L^1$ and/or $L^2$ may influence the colour of emission.

Specific examples of bidentate ligands are illustrated below:

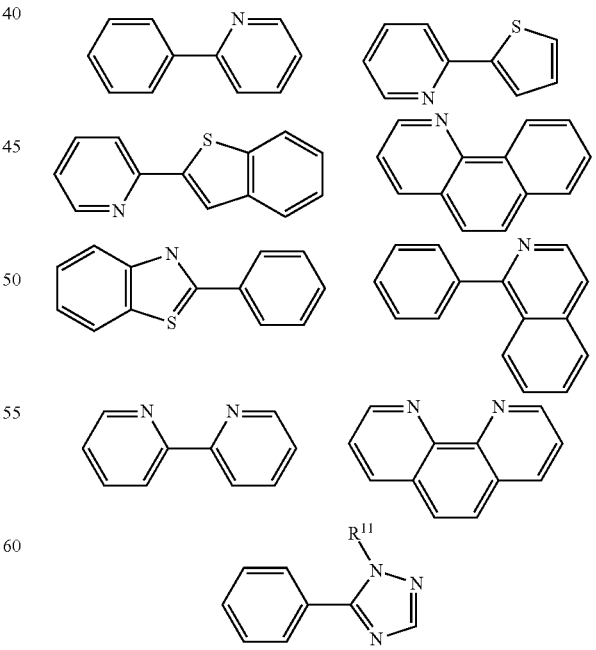

wherein $R^{11}$ is a substituent, optionally a $C_{1-40}$ hydrocarbyl group, for example a $C_{1-20}$ alkyl group. Other ligands $L^1$ and $L^2$ suitable for use with d-block elements M include diketonates, in particular acetylacetonate (acac); triarylphosphines and pyridine, each of which may be substituted.

Optionally the bidentate coordinating group is a 2-phenylpyridine group.

At least one of $L^1$ and $L^2$ is substituted with a group of formula (II), and $L^1$ and $L^2$ may each independently be substituted with one or more further substituents. In the case of a ligand of formula (III), each of $Ar^4$ and $Ar^5$ may independently be unsubstituted or may carry one or more substituents. Two or more of these substituents may be linked to form a ring, for example an aromatic ring. Particularly preferred substituents include fluorine or trifluoromethyl; $C_{1-40}$ hydrocarbyl, for example $C_{1-20}$ alkyl; $C_{1-20}$ alkoxy groups; and dendrons.

Dendrons may be used to obtain or enhance solution processability of the polymer of the invention in common organic solvents. A light-emitting dendrimer metal complex comprises a light-emitting metal complex core substituted with one or more dendrons, wherein each dendron comprises a branching point and two or more dendritic branches. Preferably, the dendron is at least partially conjugated, and at least one of the branching point and dendritic branches comprises an aryl or heteroaryl group.

A dendron may have optionally substituted formula (VIII)

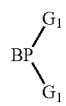

(VIII)

wherein BP represents a branching point for attachment to $L^1$ or $L^2$, and $G_1$ represents first generation branching groups.

The dendron may be a first, second, third or higher generation dendron. $G_1$ may be substituted with two or more second generation branching groups $G_2$, and so on, as in optionally substituted formula (VIIIa):

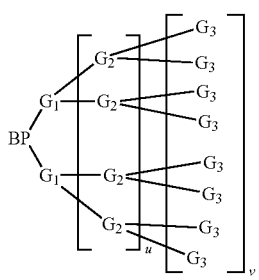

(VIIIa)

wherein u is 0 or 1; v is 0 if u is 0 or may be 0 or 1 if u is 1; BP represents a branching point for attachment to a core and $G_1$, $G_2$ and $G_3$ represent first, second and third generation dendron branching groups.

Preferably, BP is phenyl. Preferably, each group G is selected from the group consisting of aryl and heteroaryl groups. Preferably, at least some or all of the G groups are optionally substituted phenyl.

BP and/or any group G may be substituted with one or more substituents, for example one or more $C_{1-20}$ alkyl or alkoxy groups.

With reference to the group of formula (II), in one specific embodiment m is 1.

One of $Ar^1$ and $Ar^2$ is bound directly to $L^1$ or $L^2$.

Optionally, $L^2$ is substituted with a group of formula (II).

An exemplary complex of formula $ML^1L^2_n$ has formula (XIII):

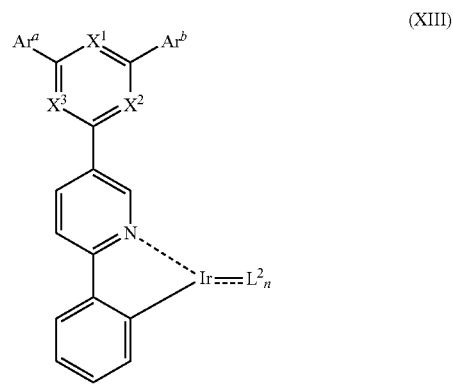

(XIII)

wherein $Ar^a$ and $Ar^b$ are each independently an aryl or heteroaryl group that may be unsubstituted or substituted with one or more substituents, for example phenyl that may be unsubstituted or substituted with one or more $C_{1-20}$ alkyl groups; and $X^1$, $X^2$ and $X^3$ are each independently N or $CR^{12}$ wherein $R^{12}$ in each occurrence is independently H or a substituent, preferably H or a $C_{1-20}$ alkyl group.

Exemplary complexes $ML^1L^2_n$ of a repeat unit of formula (Ia), (Ib) or (Ic) include complexes of formulae (Ir-1) to (Ir-45):

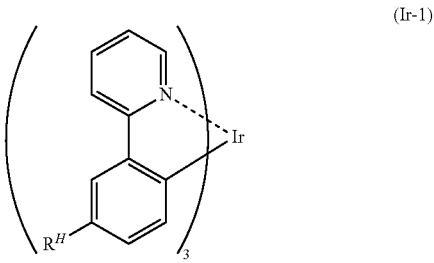

(Ir-1)

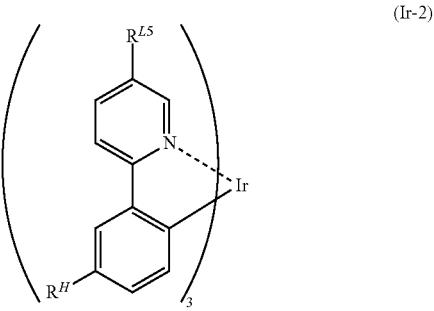

(Ir-2)

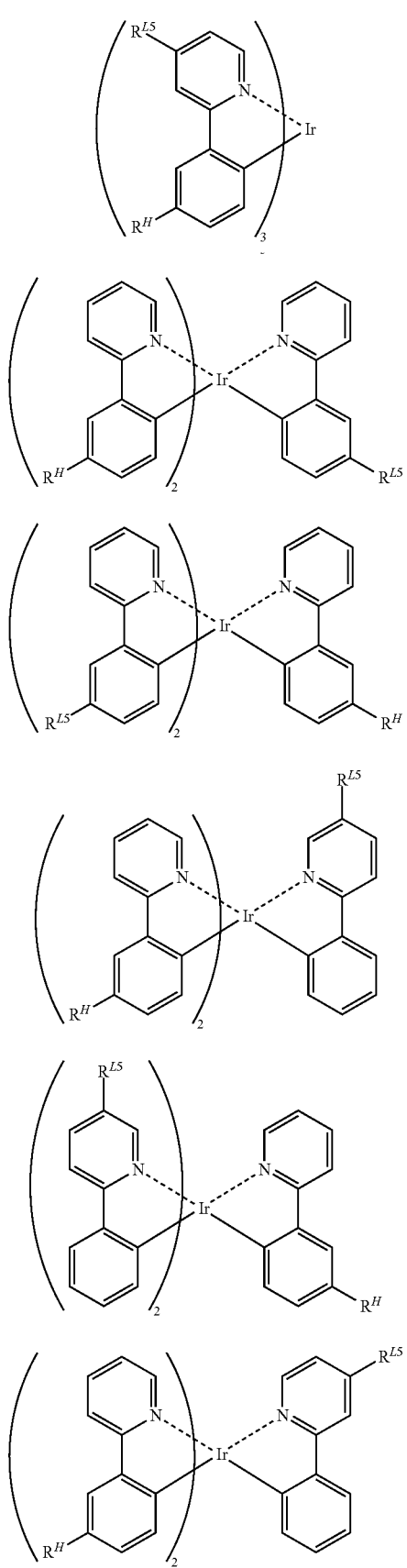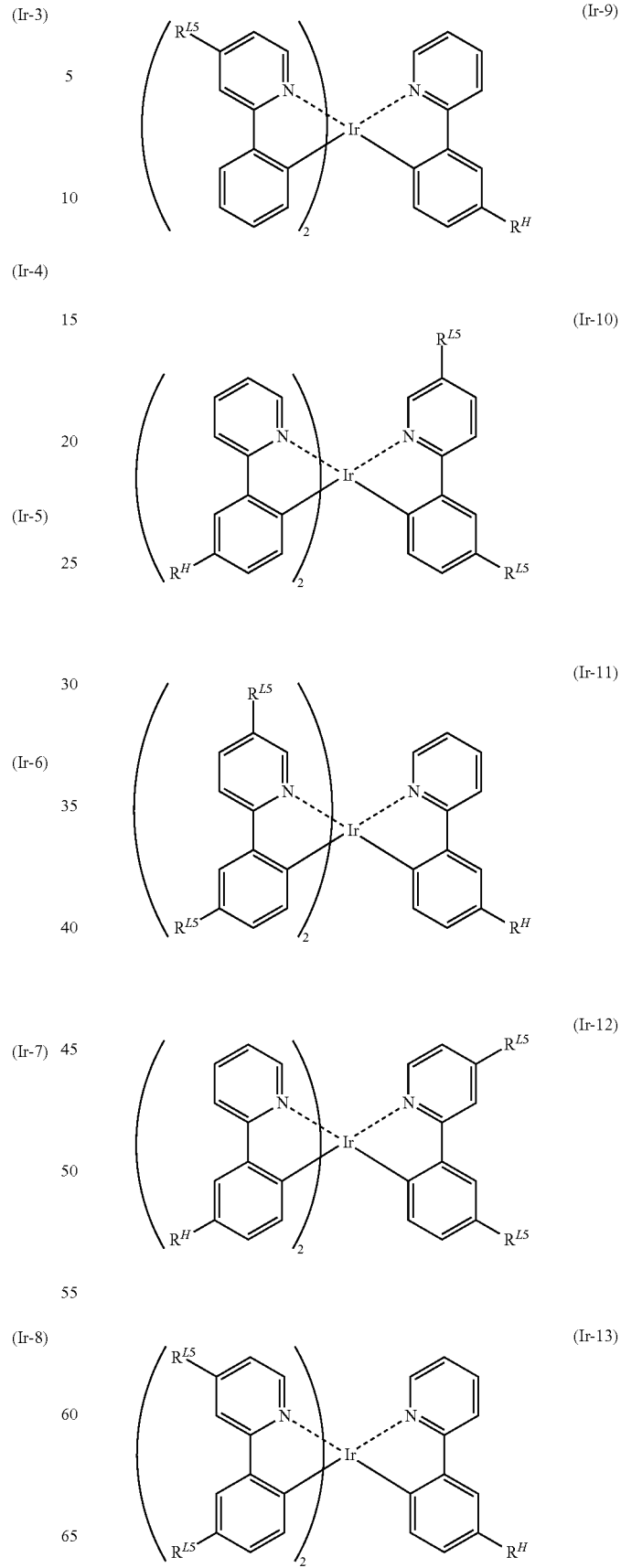

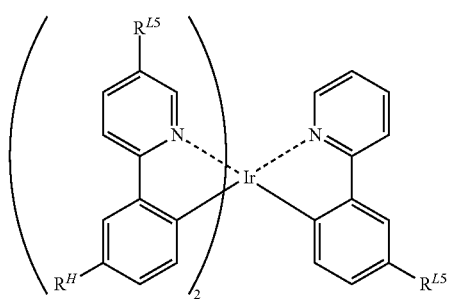 (Ir-14)
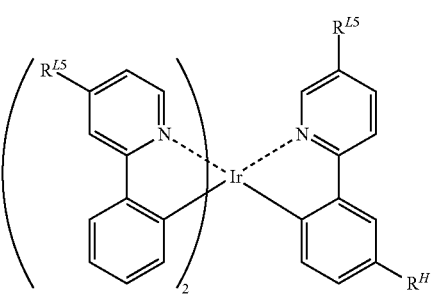 (Ir-19)
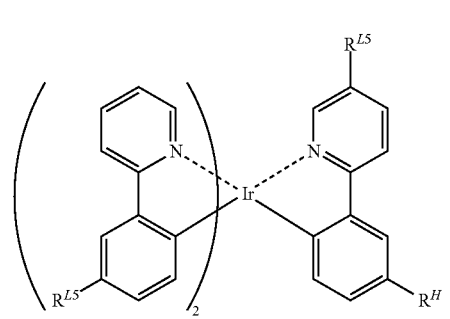 (Ir-15)
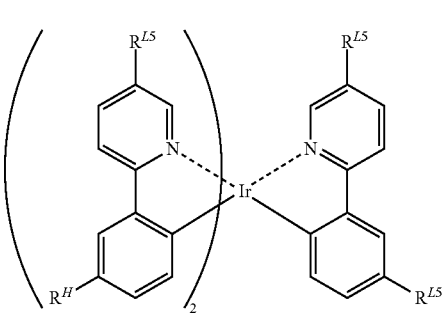 (Ir-20)
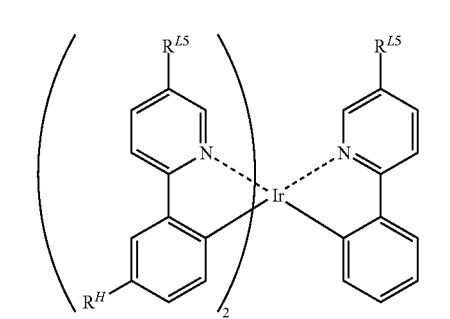 (Ir-16)
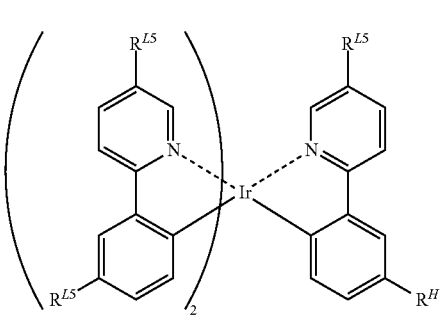 (Ir-21)
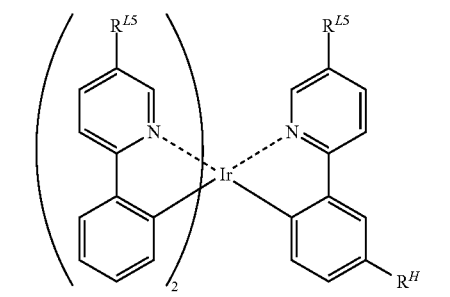 (Ir-17)
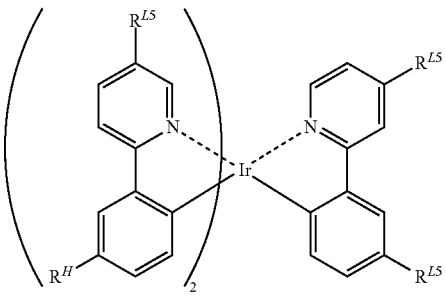 (Ir-22)
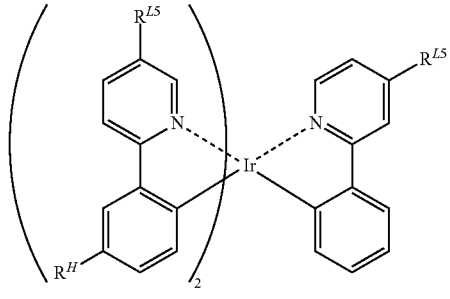 (Ir-18)
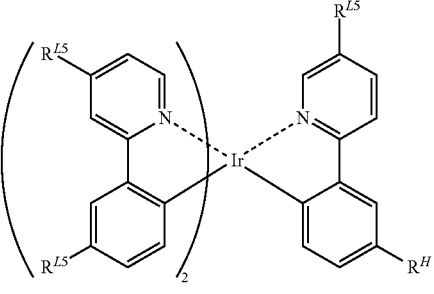 (Ir-23)

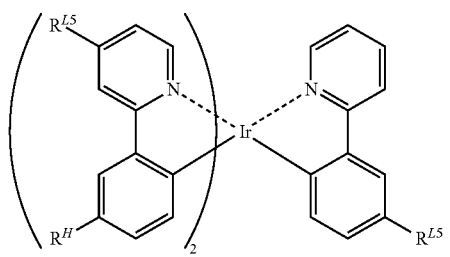
(Ir-24)
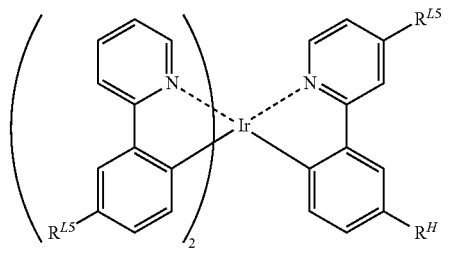
(Ir-25)
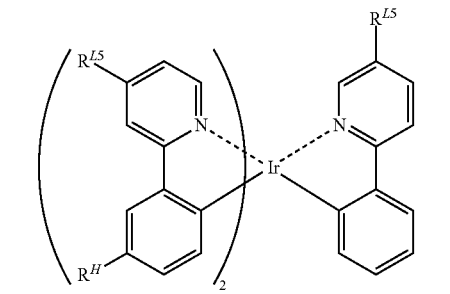
(Ir-26)
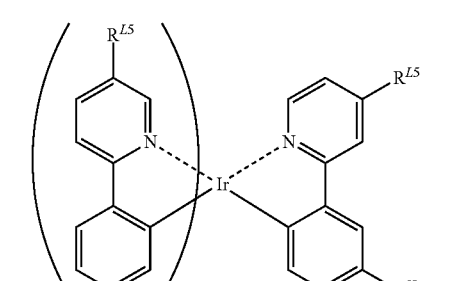
(Ir-27)
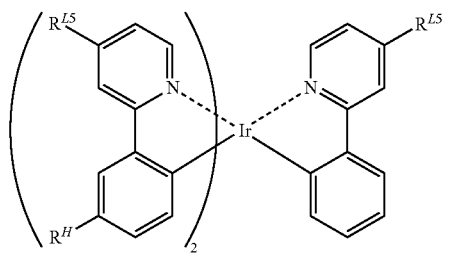
(Ir-28)
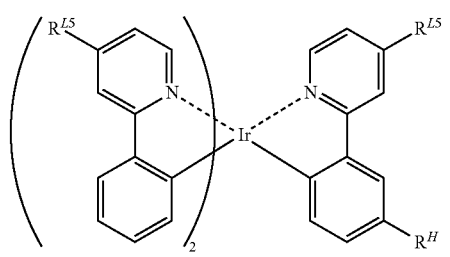
(Ir-29)
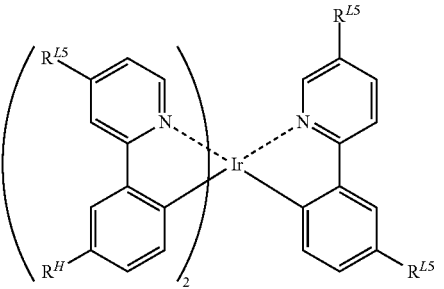
(Ir-30)
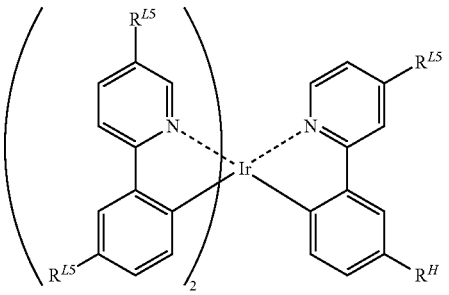
(Ir-31)
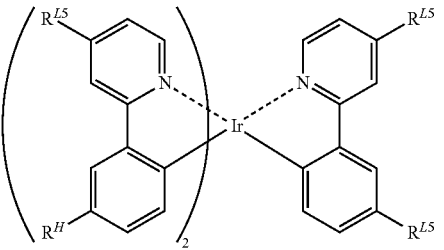
(Ir-32)
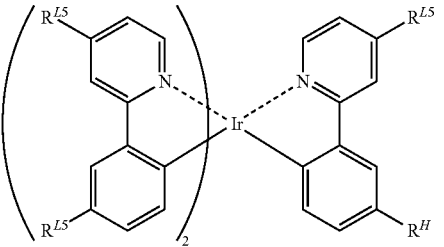
(Ir-33)
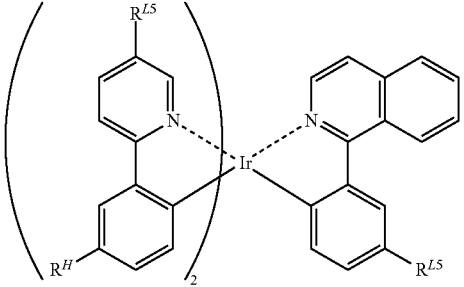
(Ir-34)

(Ir-35)
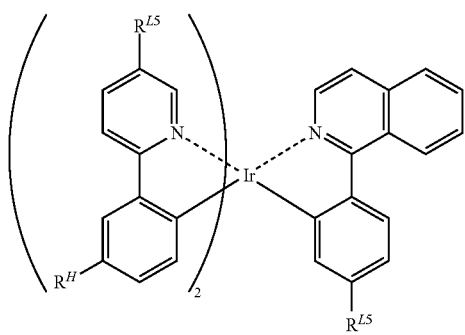
(Ir-36)
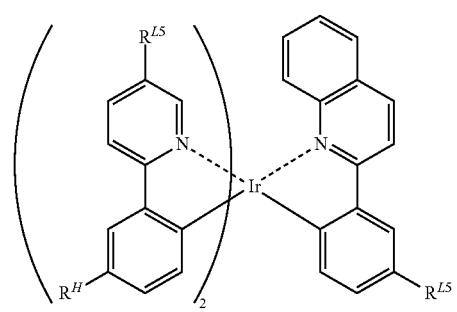
(Ir-37)
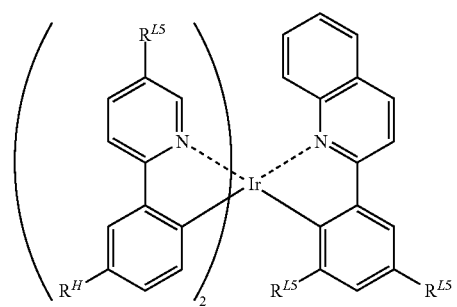
(Ir-38)
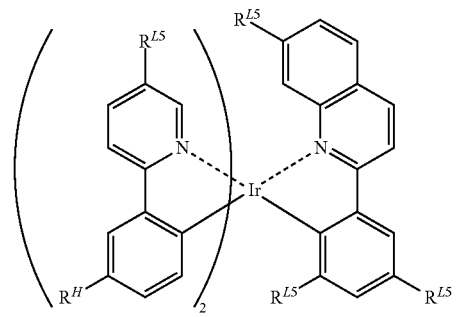
(Ir-39)
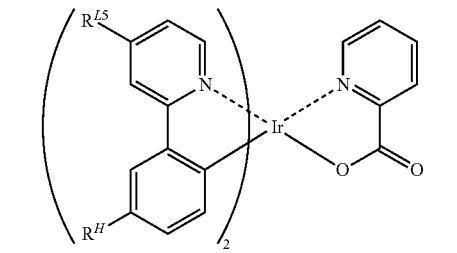
(Ir-40)
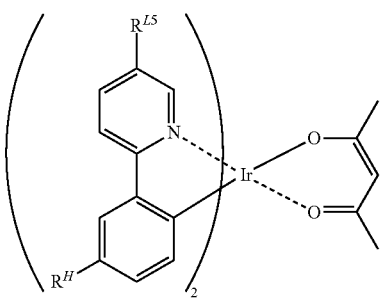
(Ir-41)
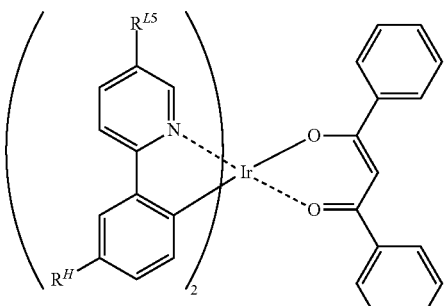
(Ir-42)
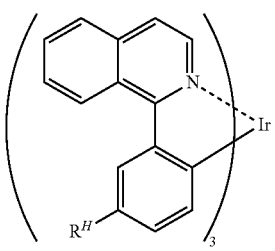
(Ir-43)
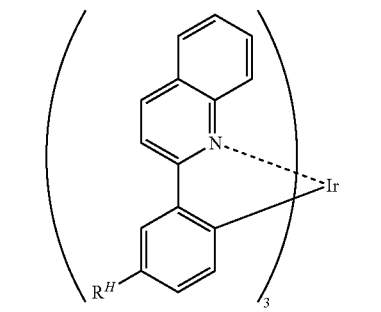
(Ir-44)
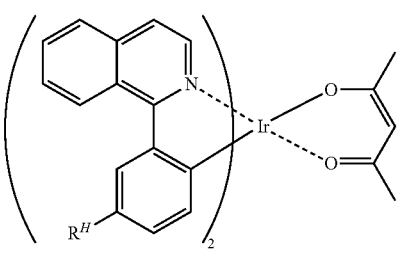

(Ir-45)
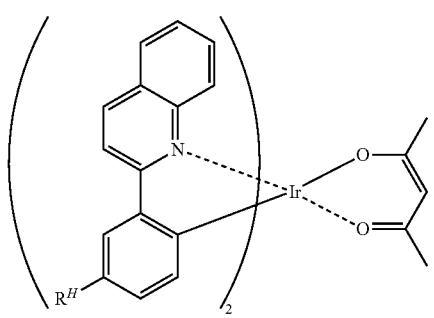
wherein $R^{L5}$ is a group selected formulae (II-01)-(II-19) and $R^H$ is a group selected from formulae (III-01)-(III-12)
II-01
CH₃
II-02
C₃H₇
II-03
n-Bu
II-04
t-Bu
II-05
C₆H₁₃
II-06
Br
II-07
II-08
II-09
II-10
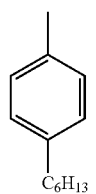
II-11
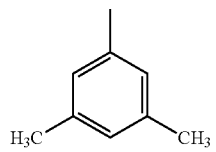
II-12
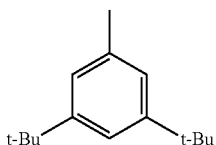
II-13
II-14
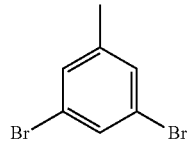
II-15
II-16
II-17
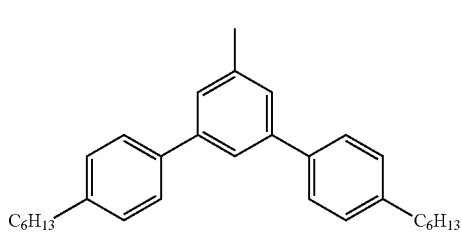

II-18
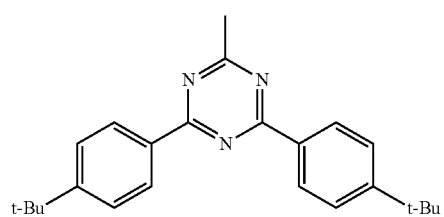
II-19
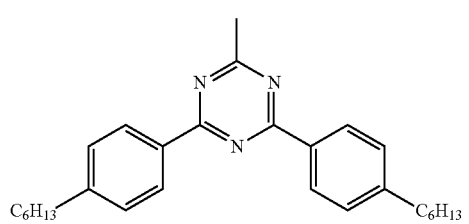
(III-01)
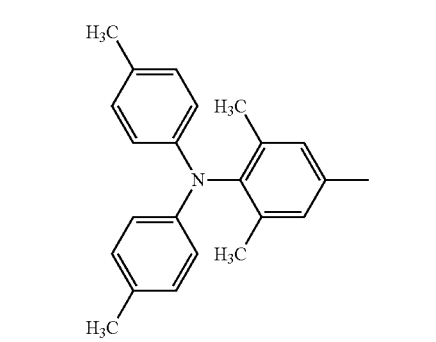
(III-02)
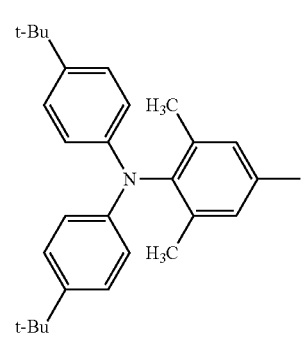
(III-03)
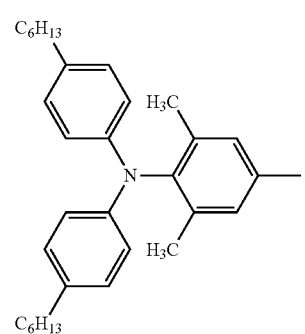
(III-04)
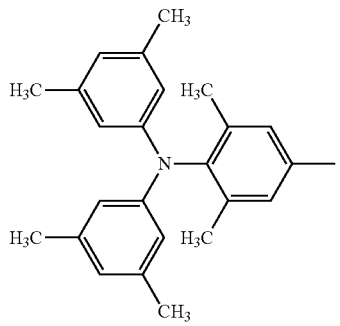
(III-05)
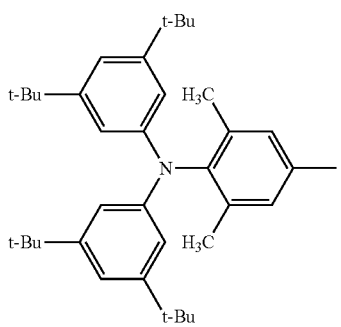
(III-06)
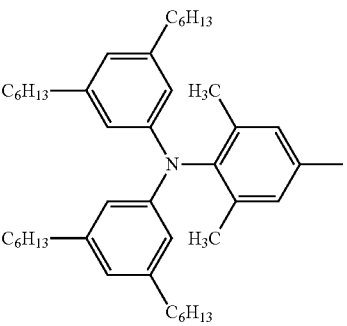
(III-07)
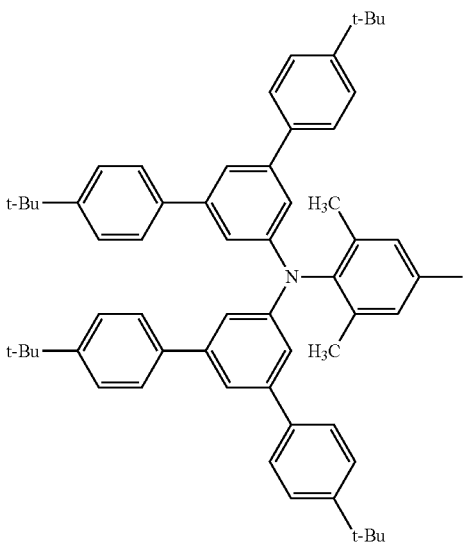

(III-08)
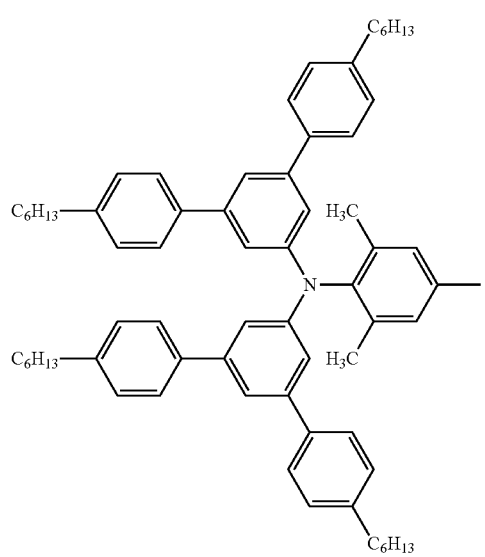

(III-09)
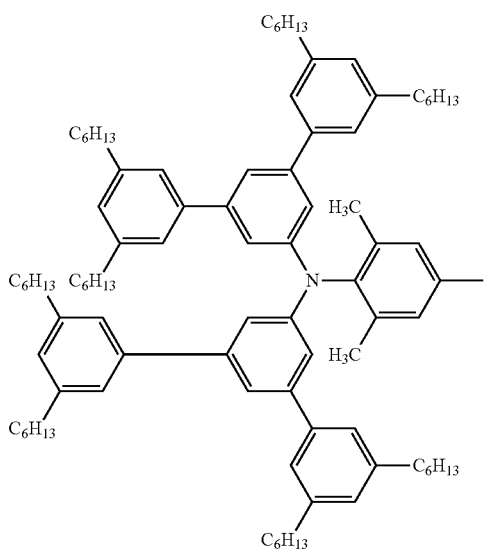

(III-11)
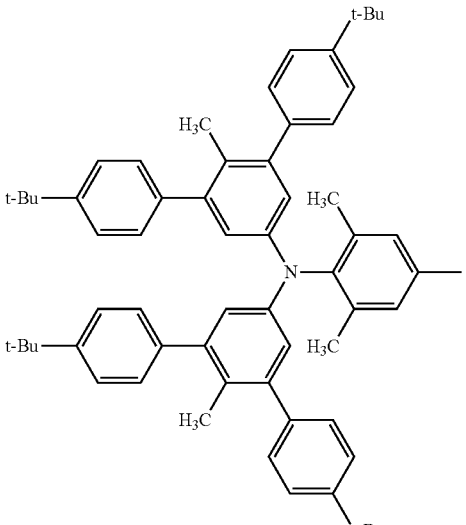

(III-12)
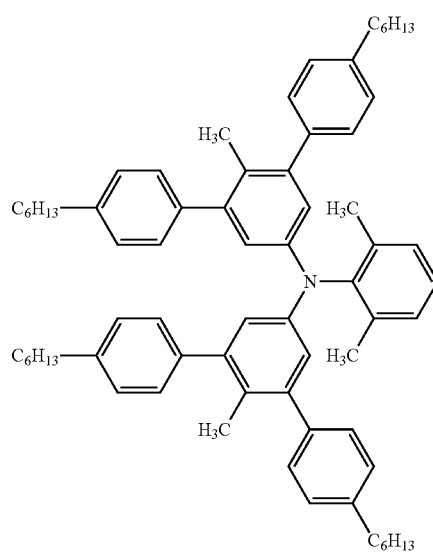

Preferably $Ar^1$, $Ar^2$ and $Ar^3$ are each phenyl, each of which may be unsubstituted or substituted with one or more substituents.

Optionally one or more of $Ar^1$, $Ar^2$ and $Ar^3$ are substituted with one or more $C_{1-40}$ hydrocarbyl groups. Preferred substituents are $C_{1-20}$ alkyl substituents. Exemplary substituents comprise a tertiary carbon atom. Substituents comprising a tert-butyl group are particularly preferred. Preferably, at least $Ar^3$ is substituted.

If the group of formula (II) is bound through $Ar^1$, $Ar^2$ or $Ar^3$ to an aromatic ligand $L^1$ or $L^2$ then there may be conjugation between the aromatic ligand and the group of formula (II). The extent of any such conjugation may be limited by providing substituents on the aromatic ligand and/or on the group of formula (II) at one or more positions adjacent to the bond between the aromatic ligand and the group of formula (II) to create steric hindrance between the ligand and the group of formula (II) and to cause the group of formula (II) to twist relative to the aromatic ligand. Exemplary substituents for creating steric hindrance may be selected from $C_{1-40}$ hydrocarbyl, for example $C_{1-20}$ alkyl. An exemplary group of formula (II) with substituents for creating a twist is illustrated below.

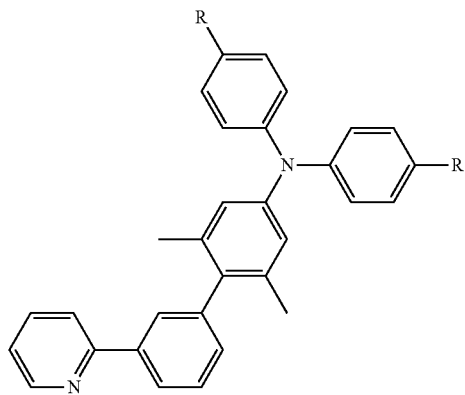

In another arrangement, the ligand $L^1$ or $L^2$ that $Ar^1$, $Ar^2$ or $Ar^3$ of the group of formula (II) is bound to may be substituted adjacent to the substitution position of the group of formula (II) with the substituent causing a twist between the ligand and the group $Ar^1$, $Ar^2$ or $Ar^3$ of formula (II) that is bound to the ligand.

Any two of $Ar^1$, $Ar^2$ and $Ar^3$ linked to the same N atom may be linked by a direct bond or a divalent linking group. A divalent linking group, where present, is preferably selected from O, S and $CR^8{}_2$ wherein $R^8$ in each occurrence is a substituent, preferably a C1-40 hydrocarbyl group, for example $C_{1-20}$ alkyl.

An exemplary group of formula (II) has the following structure, that may be unsubstituted or substituted with one or more substituents:

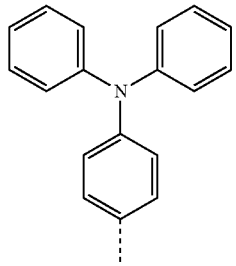

wherein --- represents a point of attachment of the group of formula (II) to $L^1$ or $L^2$. Exemplary substituted compounds of formula (II) include the following:

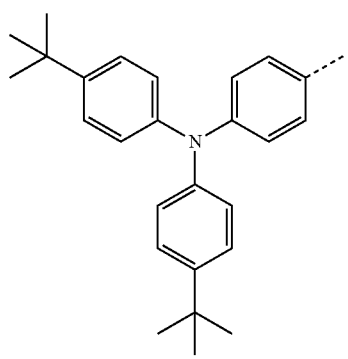

It will be appreciated that the structure illustrated above does not carry substituents at positions adjacent to a C—N bond that may result in a twist within the group of formula (II), or a substituent or substituents adjacent to the point of attachment to $L^1$ or $L^2$ that may result in a twist between the group of formula (II) and the ligand $L^1$ or $L^2$ that the group of formula (II) is bound to.

One or more substituents of $Ar^1$, $Ar^2$ or $Ar^a$ of formula (II) may be provided adjacent to the bond to the C—N bond or bonds of formula (II). This substitution may create a twist in the group of formula (II). Exemplary substituents for creating a twist include $C_{1-20}$ alkyl groups. Exemplary groups of formula (II) containing such a twist include the following compounds:

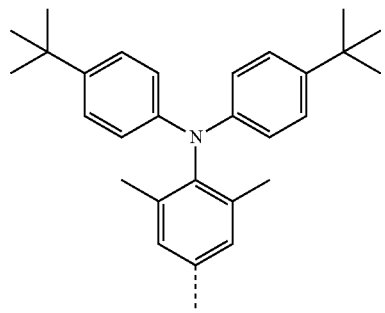

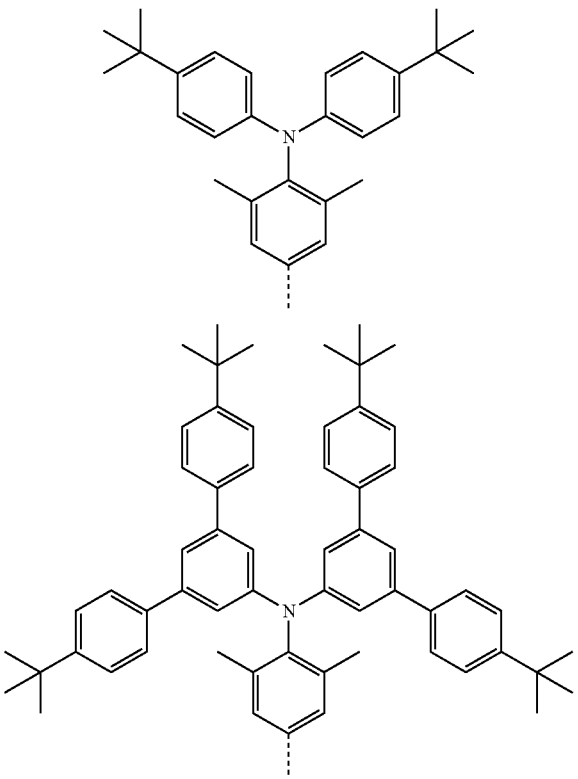

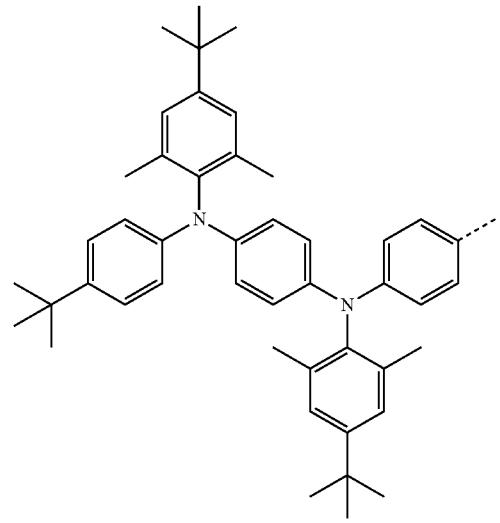

wherein --- represents a point of attachment of the group of formula (II) to $L^1$ or $L^2$.

In one embodiment, w=0 and $L^1$ is bound directly to R.

In another embodiment w is 1 and Sp is a $C_{1-30}$ hydrocarbyl group, wherein one or more non adjacent chain C atoms of the hydrocarbyl group may be replaced with O, S or COO.

Exemplary groups Sp include phenyl, $C_{1-20}$ alkyl and phenyl-$C_{1-20}$ alkyl, Exemplary repeat units according to embodiments of the invention include the following:

Polymers as described herein may emit blue light, which may have a peak photoluminescence wavelength less than or equal to about 480 nm, optionally about 400-480 nm; green light, which may have a photoluminescent spectrum with a peak in the range of greater than 480 nm-540 nm, optionally about 490-540 nm; red light, which may optionally have a peak in its photoluminescent emission spectrum at more than 580 nm-630 nm, optionally about more than 580 up to about 630 nm; or yellow light, which may optionally have a photoluminescent spectrum with a peak in the range of more than about 540 up to 580 nm.

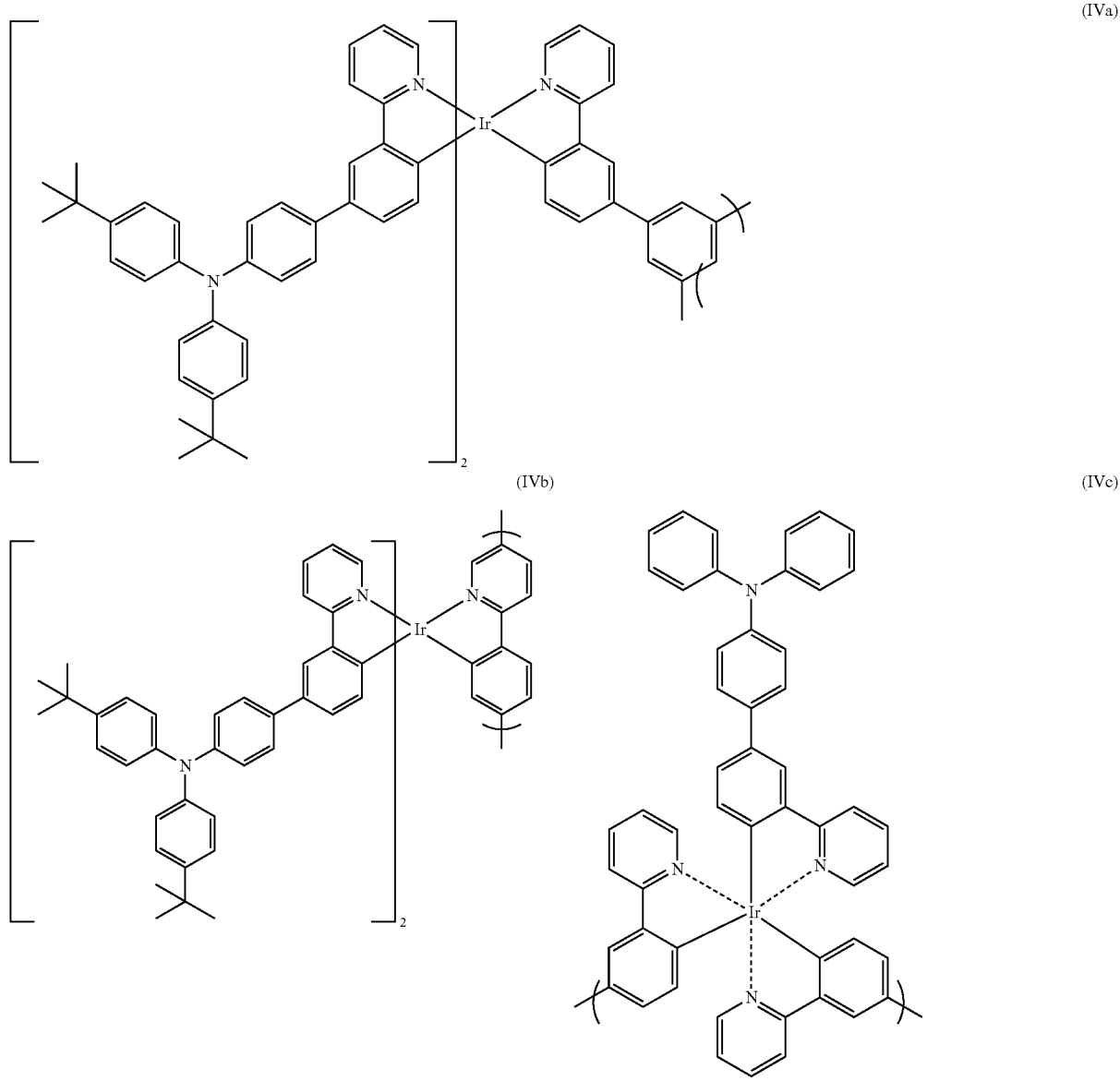

Repeat units of formulae (IVa), (IVb) and (IVc) may be substituted with one or more substituents as described above.

Polymers of the invention may contain 0.5-40 mol %, optionally 0.5-20 mol % of the repeat units of formula (I a) or (I b), for example repeat units of formula (IVa), (IVb) or (IVc)

Preferably, polymers of the invention emit in the green or yellow wavelength range. Preferably, a photoluminescent spectrum of a polymer of the invention has a peak at a wavelength in the range 540-620 nm, preferably of less than 600 nm.

Polymers of the invention are preferably copolymers comprising repeat units of formula (Ia), (Ib) or (Ic) and one or more co-repeat units.

Optionally the co-repeat unit comprises an arylene group that may be unsubstituted or substituted with one or more substituents.

Exemplary co-repeat units include optionally substituted monocyclic and polycyclic arylene groups as disclosed in for example, Adv. Mater. 2000 12(23) 1737-1750 and include: 1,2-, 1,3- and 1,4-phenylene repeat units as disclosed in J. Appl. Phys. 1996, 79, 934; 2,7-fluorene repeat units as disclosed in EP0842208; indenofluorene repeat units as disclosed in, for example, Macromolecules 2000, 33(6), 2016-2020; and spirofluorene repeat units as disclosed in, for example EP0707020. Each of these repeat units is optionally substituted. Examples of substituents include solubilising groups such as $C_{1-20}$ alkyl or alkoxy; electron withdrawing groups such as fluorine, nitro or cyano; and substituents for increasing glass transition temperature (Tg) of the polymer.

One exemplary class of arylene co-repeat units is optionally substituted fluorene group comprising repeat units, such as repeat units of formula IX:

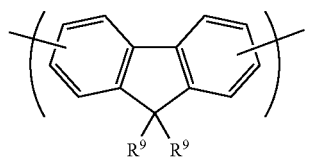

(IX)

wherein $R^9$ in each occurrence is the same or different and is H or a substituent, and wherein the two groups $R^9$ may be linked to form a ring.

Each $R^9$ is preferably a substituent, and each $R^9$ may independently be selected from the group consisting of:
  optionally substituted alkyl, optionally $C_{1-20}$ alkyl, wherein one or more non-adjacent C atoms may be replaced with optionally substituted aryl or heteroaryl, O, S, substituted N, C=O or —COO—;
  optionally substituted aryl or heteroaryl;
  a linear or branched chain of aryl or heteroaryl, each of which groups may independently be substituted, for example a group of formula —(Ar³)$_r$ as described above with reference to formula (VI); and
  a cross-linkable group, for example a group comprising a double bond such as a vinyl or acrylate group, or a benzocyclobutane group.

In the case where $R^9$ comprises aryl or heteroaryl ring system, or a linear or branched chain of aryl or heteroaryl ring systems, the or each aryl or heteroaryl ring system may be substituted with one or more substituents $R^3$ selected from the group consisting of:
  alkyl, for example $C_{1-20}$ alkyl, wherein one or more non-adjacent C atoms may be replaced with O, S, substituted N, C=O and —COO— and one or more H atoms of the alkyl group may be replaced with F or aryl or heteroaryl optionally substituted with one or more groups $R^4$,
  aryl or heteroaryl optionally substituted with one or more groups $R^4$,
  $NR^5_2$, $OR^5$, $SR^5$, and
  fluorine, nitro and cyano;
wherein each $R^4$ is independently alkyl, for example $C_{1-20}$ alkyl, in which one or more non-adjacent C atoms may be replaced with O, S, substituted N, C=O and —COO— and one or more H atoms of the alkyl group may be replaced with F, and each $R^5$ is independently selected from the group consisting of alkyl and aryl or heteroaryl optionally substituted with one or more alkyl groups.

Optional substituents for one or more of the aromatic carbon atoms of the fluorene unit are preferably selected from the group consisting of alkyl, for example $C_{1-20}$ alkyl, wherein one or more non-adjacent C atoms may be replaced with O, S, NH or substituted N, C=O and —COO—, optionally substituted aryl, optionally substituted heteroaryl, alkoxy, alkylthio, fluorine, cyano and arylalkyl. Particularly preferred substituents include $C_{1-20}$ alkyl and substituted or unsubstituted aryl, for example phenyl. Optional substituents for the aryl include one or more $C_{1-20}$ alkyl groups.

Where present, substituted N may independently in each occurrence be $NR^6$ wherein $R^6$ is alkyl, optionally $C_{1-20}$ alkyl, or optionally substituted aryl or heteroaryl. Optional substituents for aryl or heteroaryl $R^6$ may be selected from $R^5$.

Preferably, each $R^9$ is selected from the group consisting of $C_{1-20}$ alkyl and optionally substituted phenyl. Optional substituents for phenyl include one or more $C_{1-20}$ alkyl groups.

The repeat unit of formula (IX) may be a 2,7-linked repeat unit of formula (IXa):

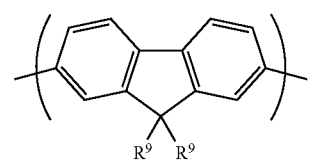

(IXa)

In one embodiment, the repeat unit of formula (IXa) is not substituted in a position adjacent to the 2- or 7-positions.

The extent of conjugation of repeat units of formulae (IX) may be limited by (a) linking the repeat unit through the 3- and/or 6-positions to limit the extent of conjugation across the repeat unit, and/or (b) substituting the repeat unit with one or more further substituents $R^9$ in or more positions adjacent to the linking positions in order to create a twist with the adjacent repeat unit or units, for example a 2,7-linked fluorene carrying a $C_{1-20}$ alkyl substituent in one or both of the 3- and 6-positions.

Another exemplary class of arylene repeat units is a phenylene repeat unit that may be unsubstituted or substituted with one or more substituents, such as a repeat unit comprising a phenylene group of formula (X):

(X)

wherein v is 0, 1, 2, 3 or 4, optionally 1 or 2, and $R^{10}$ independently in each occurrence is a substituent, optionally a substituent $R^9$ as described above with reference to formula (IX), for example $C_{1-20}$ alkyl, and phenyl that is unsubstituted or substituted with one or more $C_{1-20}$ alkyl groups.

The repeat unit of formula (X) may be 1,4-linked, 1,2-linked or 1,3-linked.

If the repeat unit of formula (X) is 1,4-linked and if v is 0 then the extent of conjugation of repeat unit of formula (X) to one or both adjacent repeat units may be relatively high.

If v is at least 1, and/or the repeat unit is 1,2- or 1,3 linked, then the extent of conjugation of repeat unit of formula (X) to one or both adjacent repeat units may be relatively low. In one preferred arrangement, the repeat unit of formula (X) is 1,3-linked and v is 0, 1, 2 or 3. In another preferred arrangement, the repeat unit of formula (X) has formula (Xa):

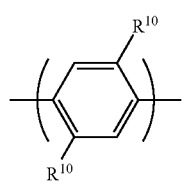

(Xa)

Further exemplary co-repeat units include repeat units comprising triazine.

Triazine-containing materials are described in more detail in WO 2008/025997 and include, for example, optionally substituted triphenyltriazine. Another exemplary co-repeat unit has formula (XIV):

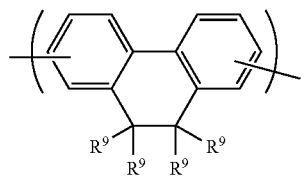

(XIV)

wherein $R^9$ is as described with reference to formula (IX) above. Any of the $R^9$ groups may be linked to any other of the $R^9$ groups to form a ring. The ring so formed may be unsubstituted or may be substituted with one or more substituents, optionally one or more $C_{1-20}$ alkyl groups.

Exemplary repeat units of formula (XIV) include units linked through 2,7-positions and through 3,6-positions.

One or more of the aromatic carbon atoms of the repeat unit of formula (XIV) may be substituted. Substituents may be selected from the group consisting of alkyl, for example $C_{1-20}$ alkyl, wherein one or more non-adjacent C atoms may be replaced with O, S, NH or substituted N, C=O and —COO—, optionally substituted aryl, optionally substituted heteroaryl, alkoxy, alkylthio, fluorine, cyano and arylalkyl. Particularly preferred substituents include $C_{1-20}$ alkyl and substituted or unsubstituted aryl, for example phenyl. Optional substituents for the aryl include one or more $C_{1-20}$ alkyl groups.

An exemplary repeat unit of formula (XIV) has the following structure, wherein aromatic carbon atoms may each independently be unsubstituted or substituted with a substituent as described above, and wherein the cyclopentyl groups may each independently be unsubstituted or substituted with one or more substituents, for example one or more $C_{1-20}$ alkyl groups:

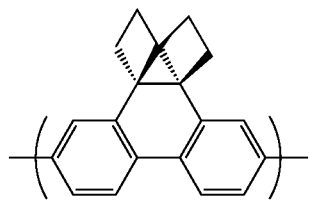

Another exemplary co-repeat unit is phenanthrene, for example phenanthrene repeat units of formula (XV):

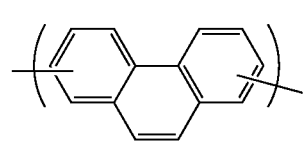

(XV)

One or more of the carbon atoms of the repeat unit of formula (XV) may be substituted with a substituent $R^{10}$ as described with reference to formula (X). Optionally, at least the 9- and 10-positions of the phenanthrene repeat unit of formula (XV) are substituted.

An exemplary triazine-comprising co-repeat unit of the polymer according to the present invention has formula (XI):

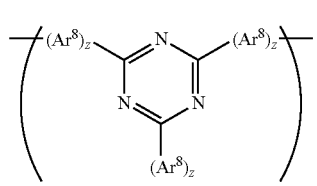

(XI)

wherein $Ar^8$ in each occurrence is independently selected from aryl or heteroaryl groups, each of which may be unsubstituted or substituted with one or more substituents, and z in each occurrence is independently at least 1, optionally 1, 2 or 3. Preferably, $Ar^8$ in each occurrence is aryl, optionally phenyl.

Preferred substituents are selected from the group $R^3$ consisting of:
alkyl, for example $C_{1-20}$ alkyl, wherein one or more non-adjacent C atoms may be replaced with O, S, substituted N, C=O and —COO— and one or more H atoms of the alkyl group may be replaced with F or aryl or heteroaryl optionally substituted with one or more groups $R^4$,
aryl or heteroaryl optionally substituted with one or more groups $R^4$,
$NR^5_2$, $OR^5$, $SR^5$,
fluorine, nitro and cyano;
wherein each $R^4$ is independently alkyl, for example $C_{1-20}$ alkyl, in which one or more non-adjacent C atoms may be replaced with O, S, substituted N, C=O and —COO— and one or more H atoms of the alkyl group may be replaced with F, and each $R^5$ is independently selected from the group consisting of alkyl and aryl or heteroaryl optionally substituted with one or more alkyl groups.

Preferably, each $Ar^8$ of formula (XI) is phenyl, each phenyl being optionally and independently substituted with one or more $C_{1-20}$ alkyl groups.

The extent of conjugation of the polymer backbone may be limited to avoid quenching of emission from the metal complex of repeat units (Ia), (Ib) or (Ic). The extent of conjugation of the polymer may be controlled by selection of the linking position of the repeat unit of formula (Ia), (Ib) or (Ic) and/or the linking position of co-repeat units, as described above.

Additionally or alternatively, conjugation of the polymer may be limited by repeat units that form a twist in the polymer backbone and/or conjugation-breaking repeat units.

An example of a repeat unit that may cause a twist in the polymer backbone (for example by steric hindrance) is 1,4-phenylene substituted with one or more groups such as one or more alkyl or alkoxy groups, e.g. $C_{1-20}$ alkyl or alkoxy groups, in particular 2,5-disubstituted-1,4-phenylene repeat units.

A conjugation breaking repeat unit that breaks conjugation between repeat units either side of the conjugation breaking repeat unit include repeat units having formula —$Ar^9$—$Sp^1$-$Ar^9$— wherein each $Ar^9$ is an optionally substituted aryl or heteroaryl group and $Sp^1$ is a spacer atom or chain comprising at least one non-conjugating atom between the two Ar groups. Exemplary Ar groups include optionally substituted phenyl. Optional substituents may be one or more substituents $R^3$ as described above, in particular one or more alkyl or alkoxy groups, e.g. $C_{1-20}$ alkyl or alkoxy groups. Exemplary groups $Sp^1$ include groups of formula —$(CH_2)_m$— wherein m is at least 1, for example an integer between 1-10, and wherein each H may independently be replaced with a substituent, for example an alkyl group, and wherein one or more carbon atoms may be replaced with a heteroatom, for example O or S.

Formulations

In a further aspect the invention provides a formulation comprising a polymer according to the invention and at least one solvent.

A polymer of the invention may be dispersed or dissolved in a solvent or mixture of two or more solvents to form a formulation that may be used to form a layer containing the polymer by depositing the formulation and evaporating the solvent or solvents. The formulation may contain one or more further materials in addition to a polymer of the invention. All of the components of the formulation may be dissolved in the solvent or solvent mixture, in which case the formulation is a solution, or one or more components may be dispersed in the solvent or solvent mixture. Exemplary solvents for use alone or in a solvent mixture include aromatic compounds, preferably benzene, that may be unsubstituted or substituted with one or more substituents selected from $C_{1-10}$ alkyl; $C_{1-10}$ alkoxy; and halogens, preferably chlorine, for example toluene, xylene or anisole.

White Light Emitting Device

A device containing a polymer of the invention may emit white light.

Optionally, white-emitting devices of the invention have a colour rendering index (CRI) higher than 70.

Optionally, the white light may have CIEx coordinate equivalent to that emitted by a black body at a temperature in the range of 2500-9000K and a CIE y coordinate within 0.05 or 0.025 of the CIE y co-ordinate of said light emitted by a black body, optionally a CIEx coordinate equivalent to that emitted by a black body at a temperature in the range of 2700-4500K.

White light may be obtained by using a combination of red, green and blue light-emitting materials or a combination of blue and yellow light-emitting materials, wherein one of the light-emitting materials is a polymer according to the invention.

Multiple light-emitting layers may be arranged as described with reference to FIG. 1B. In another arrangement, two or more light-emitting materials may be provided in a single light-emitting layer.

Exemplary blue light-emitting materials optionally have a peak photoluminescence wavelength less than or equal to about 480 nm, optionally about 400-480 nm.

A green light-emitting material may optionally have a photoluminescent spectrum with a peak in the range of greater than 480 nm-540 nm, optionally about 490-540 nm.

A red light-emitting material may optionally have a peak in its photoluminescent emission spectrum at more than 580 nm-630 nm, optionally about more than 580 up to about 630 nm.

A yellow light-emitting material may optionally have a photoluminescent spectrum with a peak in the range of more than about 540 up to 580 nm.

Further Light-Emitting Materials

In the case where a device according to the invention contains a light-emitting polymer of the invention and one or more further light-emitting materials, the further light-emitting material or materials may be selected from fluorescent and phosphorescent light-emitting materials. Further light-emitting materials may be small molecule, polymeric or dendrimeric materials.

Suitable further phosphorescent light-emitting materials include metal complexes comprising optionally substituted complexes of formula (XII):

(XII)

wherein $M^1$ is a metal; each of $L^4$, $L^5$ and $L^6$ is a coordinating group; q is an integer; r and s are each independently 0 or an integer; and the sum of (a.q)+(b.r)+(c.s) is equal to the number of coordination sites available on M, wherein a is the number of coordination sites on $L^4$, b is the number of coordination sites on $L^5$ and c is the number of coordination sites on $L^6$.

Suitable metals M include d-block metals, in particular those in rows 2 and 3 i.e. elements 39 to 48 and 72 to 80, in particular ruthenium, rhodium, palladium, rhenium, osmium, iridium, platinum and gold. Iridium is particularly preferred.

Ligands $L^4$, $L^5$ and $L^6$ are preferably selected from unsubstituted or substituted ligands of formula (III) as described above. Exemplary substituents include fluorine; trifluoromethyl; $C_{1-40}$ hydrocarbyl, for example $C_{1-20}$ alkyl; $C_{1-20}$ alkoxy groups, and dendrons. Dendron substituents may be as described above with reference to formulae (VIII) and (VIIIa).

Further phosphorescent light-emitting materials are preferably used in combination with a small molecule or polymeric host material. Preferably, the polymeric host has a $T_1$ excited state energy level that is higher than that of the further phosphorescent light-emitting material it is used with. Polymeric hosts include polymers having a conjugated backbone and polymers having a non-conjugated backbone. If used with a polymeric host, a further phosphorescent light-emitting material may be mixed with the host material or covalently bound in the main chain of the polymeric host or provided as a side-chain substituent or end group of the polymer.

Exemplary fluorescent further light-emitting materials may be any form of material, including small molecule, polymeric and dendrimeric materials. Blue fluorescent polymeric materials include materials that have a partially conjugated, fully conjugated or non-conjugated polymer backbone.

An exemplary blue emitter is an at least partially conjugated polymeric emitter comprising optionally substituted (hetero)arylene repeat units, for example optionally substituted fluorene, phenylene and/or indenofluorene repeat units, and/or (hetero)arylamine repeat units.

An exemplary blue emitter comprises at least 50 mol % of fluorene repeat units and up to 50 mol %, up to 30 mol % or up to 15 mol % of (hetero)arylamine repeat units.

Charge Transporting Layers

A hole transporting layer may be provided between the anode and the light-emitting layers. Likewise, an electron transporting layer may be provided between the cathode and the light-emitting layers.

Similarly, an electron blocking layer may be provided between the anode and the light-emitting layer and a hole blocking layer may be provided between the cathode and the light-emitting layer. Transporting and blocking layers may be used in combination. Depending on its HOMO and LUMO levels, a single layer may both transport one of holes and electrons and block the other of holes and electrons.

If present, a hole transporting layer located between the anode and the light-emitting layers preferably has a HOMO level of less than or equal to 5.5 eV, more preferably around 4.8-5.5 eV. The HOMO level of the hole transport layer may be selected so as to be within 0.2 eV, optionally within 0.1 eV, of an adjacent layer (such as a light-emitting layer) in order to provide a small barrier to hole transport between these layers.

If present, an electron transporting layer located between the light-emitting layers and cathode preferably has a LUMO level of around 2.5-3.5 eV. For example, a layer of a silicon monoxide or silicon dioxide or other thin dielectric layer having thickness in the range of 0.2-2 nm may be provided between the light-emitting layer nearest the cathode and the cathode. HOMO and LUMO levels may be measured by cyclic voltammetry.

A hole transporting layer may contain a hole-transporting (hetero)arylamine, such as a homopolymer or copolymer comprising hole transporting arylamine repeat units.

A hole-transporting layer may be cross-linkable, in particular if it is formed by depositing a hole transporting material from a solution in a solvent.

Polymer Synthesis

Preferred methods for preparation of conjugated polymers comprising repeat units of formula (Ia), (Ib) and/or (Ic) as described above, comprise a "metal insertion" wherein the metal atom of a metal complex catalyst is inserted between an aryl or heteroaryl group and a leaving group of a monomer. Exemplary metal insertion methods are Suzuki polymerisation as described in, for example, WO 00/53656 and Yamamoto polymerisation as described in, for example, T. Yamamoto, "Electrically Conducting And Thermally Stable pi—Conjugated Poly(arylene)s Prepared by Organometallic Processes", Progress in Polymer Science 1993, 17, 1153-1205. In the case of Yamamoto polymerisation, a nickel complex catalyst is used; in the case of Suzuki polymerisation, a palladium complex catalyst is used.

For example, in the synthesis of a linear polymer by Yamamoto polymerisation, a monomer having two reactive halogen groups is used. Similarly, according to the method of Suzuki polymerisation, at least one reactive group is a boron derivative group such as a boronic acid or boronic ester and the other reactive group is a halogen. Preferred halogens are chlorine, bromine and iodine, most preferably bromine.

It will therefore be appreciated that repeat units illustrated throughout this application may be derived from a monomer carrying suitable leaving groups. Likewise, an end group or side group may be bound to the polymer by reaction of a suitable leaving group.

Suzuki polymerisation may be used to prepare regioregular, block and random copolymers. In particular, homopolymers or random copolymers may be prepared when one reactive group is a halogen and the other reactive group is a boron derivative group. Alternatively, block or regioregular copolymers may be prepared when both reactive groups of a first monomer are boron and both reactive groups of a second monomer are halogen.

As alternatives to halides, other leaving groups capable of participating in metal insertion include sulfonic acids and sulfonic acid esters such as tosylate, mesylate and triflate.

Hole Injection Layers

A conductive hole injection layer, which may be formed from a conductive organic or inorganic material, may be provided between the anode and the light-emitting layers to assist hole injection from the anode into the layer or layers of semiconducting polymer. A hole transporting layer may be used in combination with a hole injection layer.

Examples of doped organic hole injection materials include optionally substituted, doped poly(ethylene dioxythiophene) (PEDT), in particular PEDT doped with a charge-balancing polyacid such as polystyrene sulfonate (PSS) as disclosed in EP 0901176 and EP 0947123, polyacrylic acid or a fluorinated sulfonic acid, for example Nafion®; polyaniline as disclosed in U.S. Pat. No. 5,723,873 and U.S. Pat. No. 5,798,170; and optionally substituted polythiophene or poly(thienothiophene). Examples of conductive inorganic materials include transition metal oxides such as VOx MoOx and RuOx as disclosed in Journal of Physics D: Applied Physics (1996), 29(11), 2750-2753.

Cathode

The cathode is selected from materials that have a work function allowing injection of electrons into the light-emitting layer or layers of the device. Other factors influence the selection of the cathode such as the possibility of adverse interactions between the cathode and the light-emitting materials. The cathode may consist of a single material such as a layer of aluminium. Alternatively, it may comprise a plurality of metals, for example a bilayer of a low workfunction material and a high workfunction material such as calcium and aluminium as disclosed in WO 98/10621. The cathode may contain a layer of elemental barium, for example as disclosed in WO 98/57381, Appl. Phys. Lett. 2002, 81(4), 634 and WO 02/84759. The cathode may contain one or more conductive layers, for example one or more metal layers, and a thin (e.g. 1-5 nm) layer of a metal compound between the one or more conductive layers and the light-emitting layer or layers. Exemplary metal compounds include oxides or fluorides of an alkali or alkali earth metal, for example lithium fluoride as disclosed in WO 00/48258; barium fluoride as disclosed in Appl. Phys. Lett. 2001, 79(5), 2001; and barium oxide. In order to provide efficient injection of electrons into the device, the cathode preferably has a workfunction of less than 3.5 eV, more preferably less than 3.2 eV, most preferably less than 3 eV. Work functions of metals can be found in, for example, Michaelson, J. Appl. Phys. 48(11), 4729, 1977.

The cathode may be opaque or transparent. Transparent cathodes are particularly advantageous for active matrix devices because emission through a transparent anode in such devices is at least partially blocked by drive circuitry located underneath the emissive pixels. A transparent cathode comprises a layer of an electron injecting material that is sufficiently thin to be transparent. Typically, the lateral conductivity of this layer will be low as a result of its thinness. In this case, the layer of electron injecting material is used in combination with a thicker layer of transparent conducting material such as indium tin oxide.

It will be appreciated that a transparent cathode device need not have a transparent anode (unless, of course, a fully transparent device is desired), and so the transparent anode used for bottom-emitting devices may be replaced or supplemented with a layer of reflective material such as a layer of aluminium. Examples of transparent cathode devices are disclosed in, for example, GB 2348316.

Encapsulation

Organic optoelectronic devices tend to be sensitive to moisture and oxygen. Accordingly, the substrate preferably has good barrier properties for prevention of ingress of moisture and oxygen into the device. The substrate is commonly glass, however alternative substrates may be used, in particular where flexibility of the device is desirable. For example, the substrate may comprise a plastic as in U.S. Pat. No. 6,268,695 which discloses a substrate of alternating plastic and barrier layers or a laminate of thin glass and plastic as disclosed in EP 0949850.

The device may be encapsulated with an encapsulant (not shown) to prevent ingress of moisture and oxygen. Suitable encapsulants include a sheet of glass, films having suitable barrier properties such as silicon dioxide, silicon monoxide, silicon nitride or alternating stacks of polymer and dielectric as disclosed in, for example, WO 01/81649 or an airtight container as disclosed in, for example, WO 01/19142. In the case of a transparent cathode device, a transparent encapsulating layer such as silicon monoxide or silicon dioxide may be deposited to micron levels of thickness, although in one preferred embodiment the thickness of such a layer is in the range of 20-300 nm. A getter material for absorption of any atmospheric moisture and/or oxygen that may permeate through the substrate or encapsulant may be disposed between the substrate and the encapsulant.

Formulation and Solution Processing

Suitable solvents for forming formulations of the polymer for solution processing include many common organic solvents, such as mono- or poly-alkylbenzenes such as toluene and xylene.

Exemplary solution deposition techniques include printing and coating techniques, such as spin-coating, dip-coating, roll-to-roll coating or roll-to-roll printing, doctor blade coating, slot die coating, gravure printing, screen printing and inkjet printing.

Multiple organic layers of an OLED may be formed by deposition of formulations containing the active materials for each layer.

Coating methods, such as spin-coating described above, are particularly suitable for devices wherein patterning of the electroluminescent material is unnecessary, for example for lighting applications or simple monochrome segmented displays.

Printing is particularly suitable for high information content displays, in particular full colour displays. A device may be inkjet printed by providing a patterned layer over the first electrode and defining wells for printing of one colour (in the case of a monochrome device) or multiple colours (in the case of a multicolour, in particular full colour device). The patterned layer is typically a layer of photoresist that is patterned to define wells as described in, for example, EP 0880303.

As an alternative to wells, the ink may be printed into channels defined within a patterned layer. In particular, the photoresist may be patterned to form channels which, unlike wells, extend over a plurality of pixels and which may be closed or open at the channel ends.

A number of methods may be used to at least partially avoid dissolution of an underlying organic layer during solution deposition of one or more further organic layers on the underlying organic layer. The underlying organic layer may be rendered insoluble by cross-linking prior to solution deposition of a further layer. Cross-linking may be provided by substituents on the materials forming the underlying layer, such as cross-linking substituents on the host and/or dopant material of a light-emitting layer. Where a layer to be cross-linked contains a polymer, the cross-linkable groups may be provided as substituents of repeat units of the polymer as described above.

The polymer according to the invention may comprise one or more co-repeat units substituted with a cross-linking group. Exemplary crosslinking groups include a polymerisable double bond group such as a vinyl or acrylate group, a benzocyclobutane group, and an oxetane group, each of which may optionally be substituted.

Alternatively or additionally, a cross-linkable additive may be included in the composition used to form the underlying layer.

Alternatively or additionally, the further layer may be formed from a solution comprising a solvent in which the underlying organic layer is insoluble.

Applications

OLEDs as described herein may be used in a wide range of applications, including but not limited to use as display backlights, for example LCD backlights, area illumination and displays. White light-emitting OLEDs may comprise uniform emissive layers. OLEDs for use in displays may comprise a patterned emissive layer or layers and/or a patterned electrode to provide individual display pixels.

EXAMPLES
Monomer Example 1
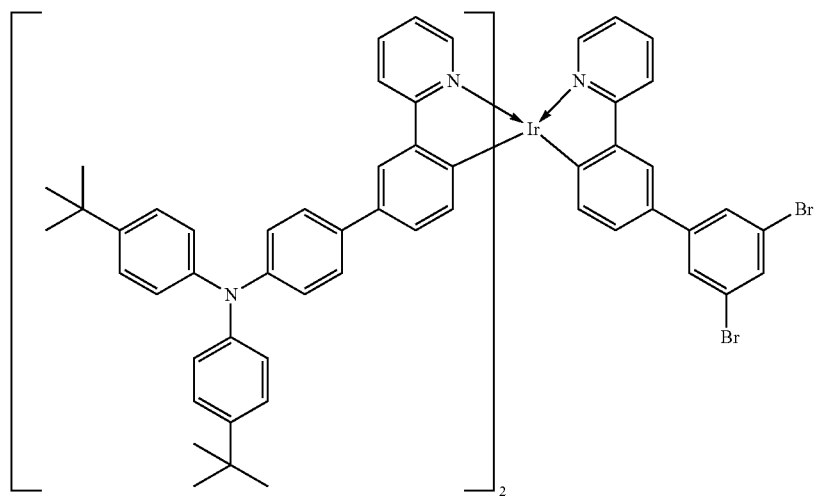
Monomer Example 1 was prepared according to the following reaction scheme:
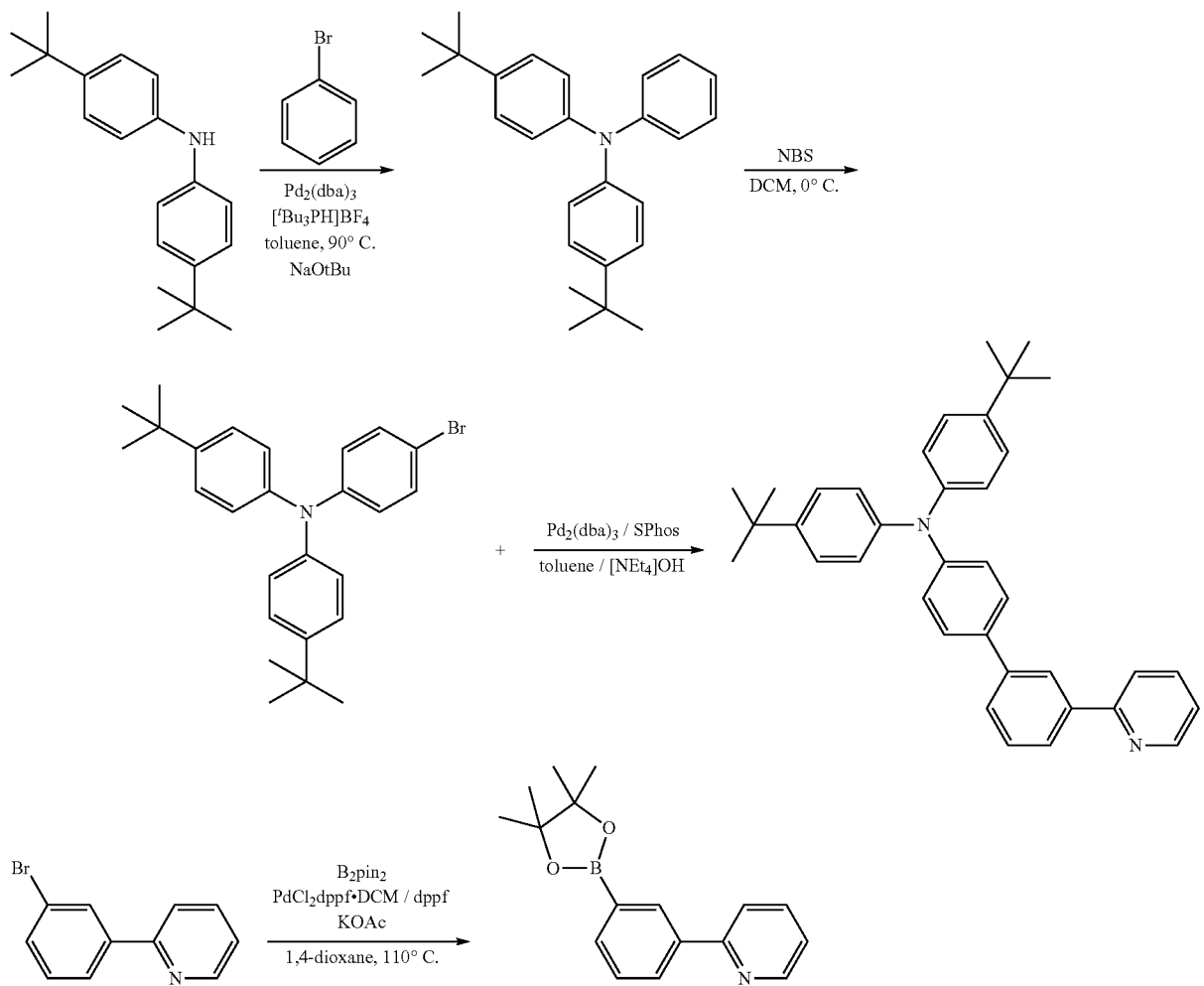

-continued
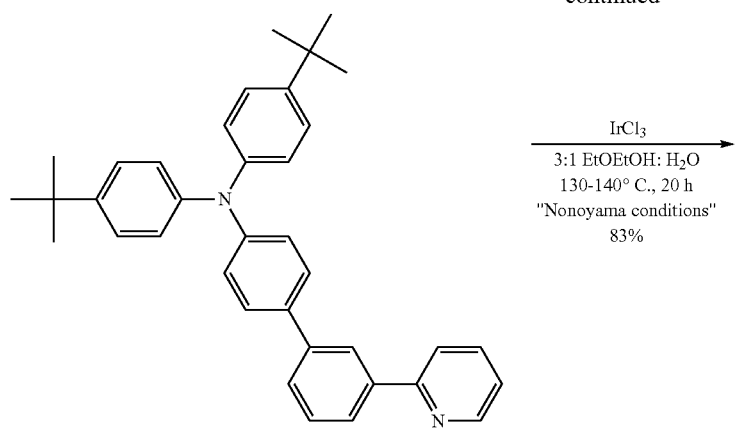
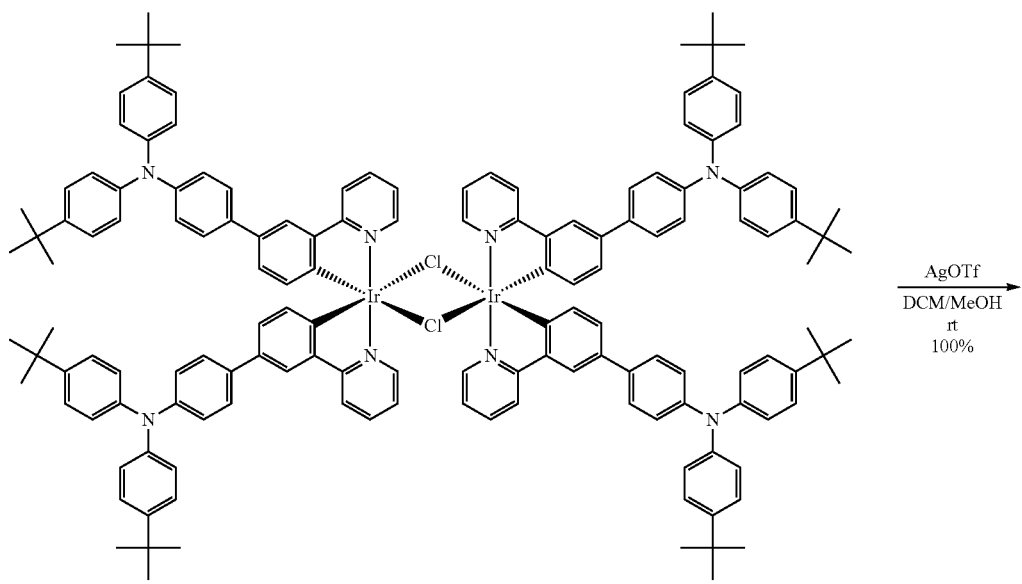
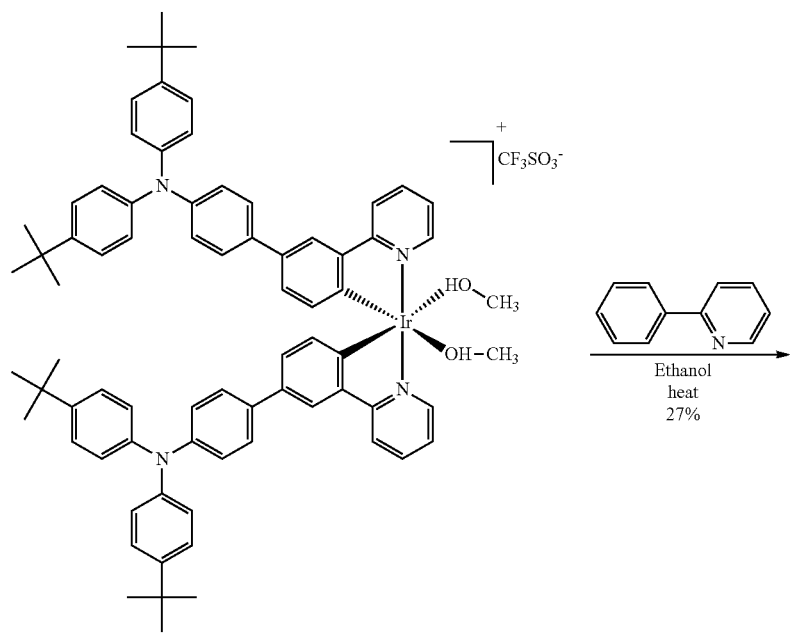

-continued
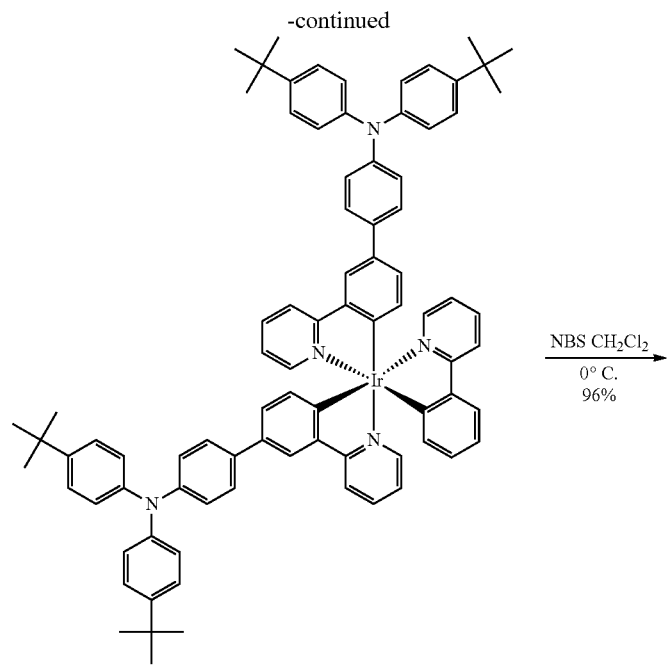
NBS CH$_2$Cl$_2$
0° C.
96%
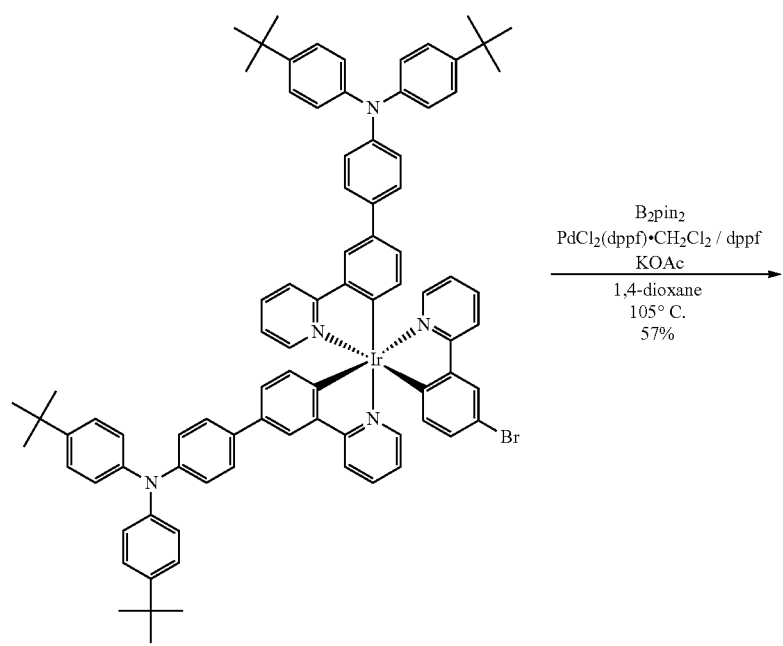
B$_2$pin$_2$
PdCl$_2$(dppf)·CH$_2$Cl$_2$ / dppf
KOAc
1,4-dioxane
105° C.
57%

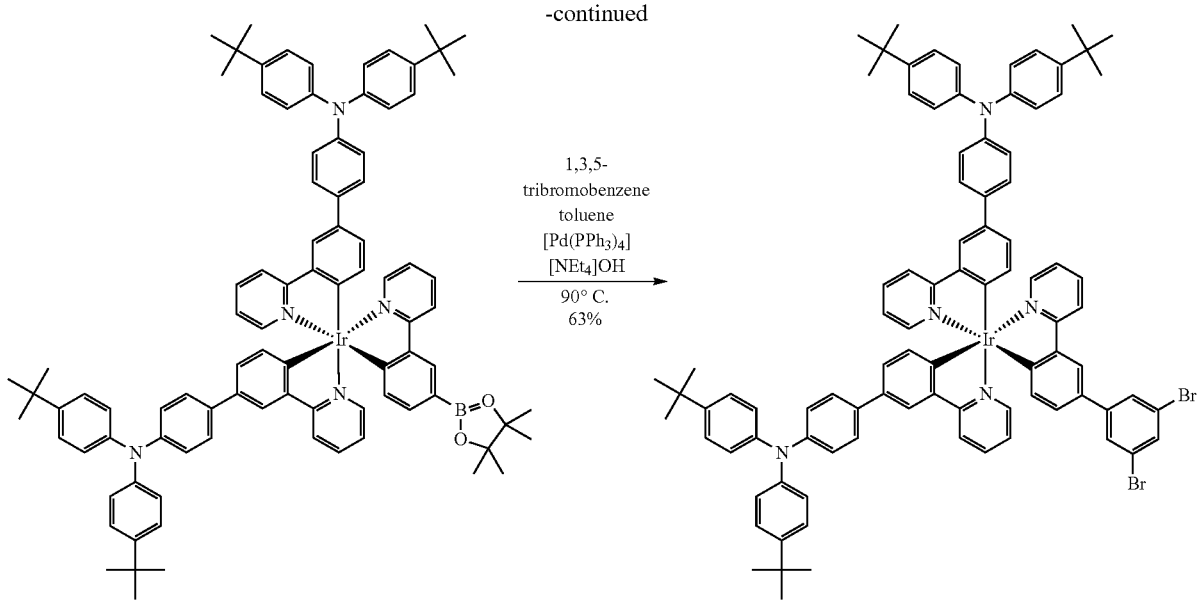

Polymer Example 1 and Comparative Polymer 1

Polymer Example 1 was prepared by Suzuki polymerisation as described in WO 00/53656 of monomers including Monomer Example 1.

Comparative Polymer 1 was prepared in the same way, but using Comparative Monomer 1 in place of Monomer Example 1.

Monomers used in preparation of Polymer Example 1 and Comparative Polymer 1 are provided in Table 1.

TABLE 1

| Polymer Example 1 and Comparative Polymer 1 monomers composition | | |
|---|---|---|
| Monomer | Polymer Example 1 (mol %) | Comparative Polymer 1 (mol %) |
| (boronic ester monomer with $C_6H_{13}$ groups) | 50 | 50 |
| (dibromofluorene monomer with $C_6H_{13}$ groups) | 24.5 | 20.7 |

TABLE 1-continued

Polymer Example 1 and Comparative Polymer 1 monomers composition

| Monomer | Polymer Example 1 (mol %) | Comparative Polymer 1 (mol %) |
| --- | --- | --- |
| 4,4'-(6-(4-dodecylphenyl)-1,3,5-triazine-2,4-diyl)bis(bromobenzene) | 11.5 | 11.5 |
| 2,7-dibromo-9,9-di(pent-4-en-1-yl)-9H-fluorene | 5 | 5 |
| 2,7-dibromo-9,9-bis(bicyclo[4.2.0]octa-1,3,5-trien-3-yl)-9H-fluorene | 5 | 5 |
| Monomer Example 1 | 4 | — |

TABLE 1-continued

Polymer Example 1 and Comparative Polymer 1 monomers composition

| Monomer | Polymer Example 1 (mol %) | Comparative Polymer 1 (mol %) |
|---|---|---|
| 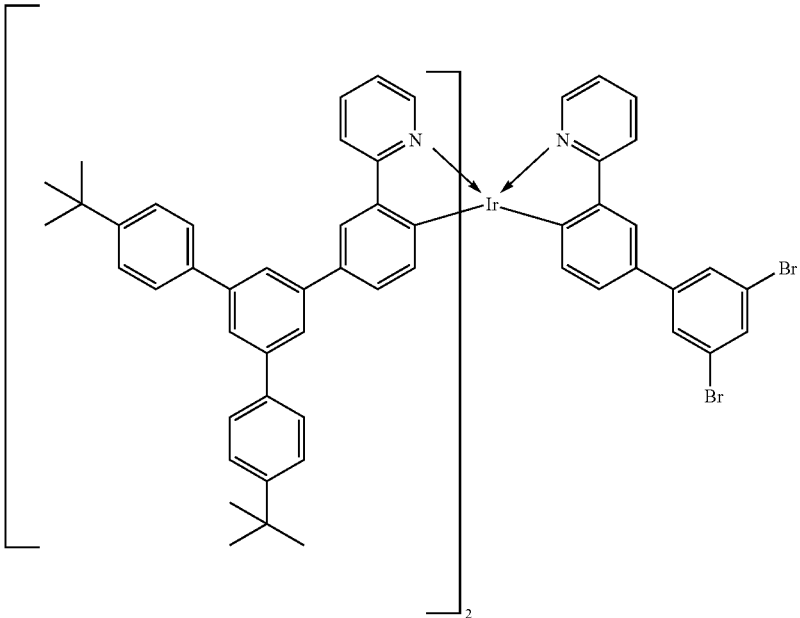<br>Comparative Monomer 1 | — | 7.8 |

Polymer Example 2 and Comparative Polymer 2

Polymer Example 2 was prepared by Suzuki polymerisation as described in WO 00/53656 of monomers including Monomer Example 1.

Comparative Polymer 2 was prepared in the same way, but using Comparative Monomer 1 in place of Monomer Example 1.

Monomers used in preparation of Polymer Example 2 and Comparative Polymer 2 are provided in Table 1.

TABLE 2

Polymer Example 2 and COmparative Polymer 2 monomers composition

| Monomer | Polymer Example 1 (mol %) | Comparative Polymer 1 (mol %) |
|---|---|---|
| 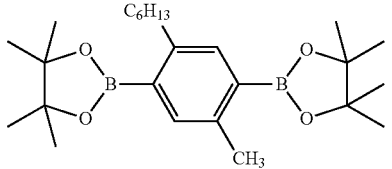 | 50 | 50 |
| 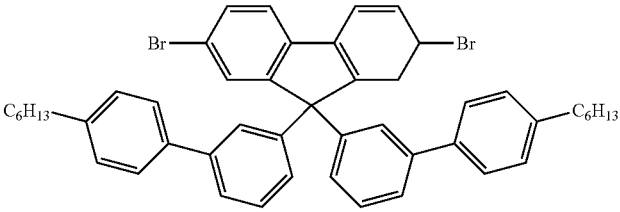 | 35.5 | 33.32 |

TABLE 2-continued

Polymer Example 2 and COmparative Polymer 2 monomers composition

| Monomer | Polymer Example 1 (mol %) | Comparative Polymer 1 (mol %) |
|---|---|---|
| [structure: 2,4-bis(4-bromophenyl)-6-(4-dodecylphenyl)-1,3,5-triazine] | 11.5 | 2 |
| Monomer Example 1 [Ir complex structure] | 3 | — |

Monomer Example 1

TABLE 2-continued

Polymer Example 2 and COmparative Polymer 2 monomers composition

| Monomer | Polymer Example 1 (mol %) | Comparative Polymer 1 (mol %) |
|---|---|---|
| 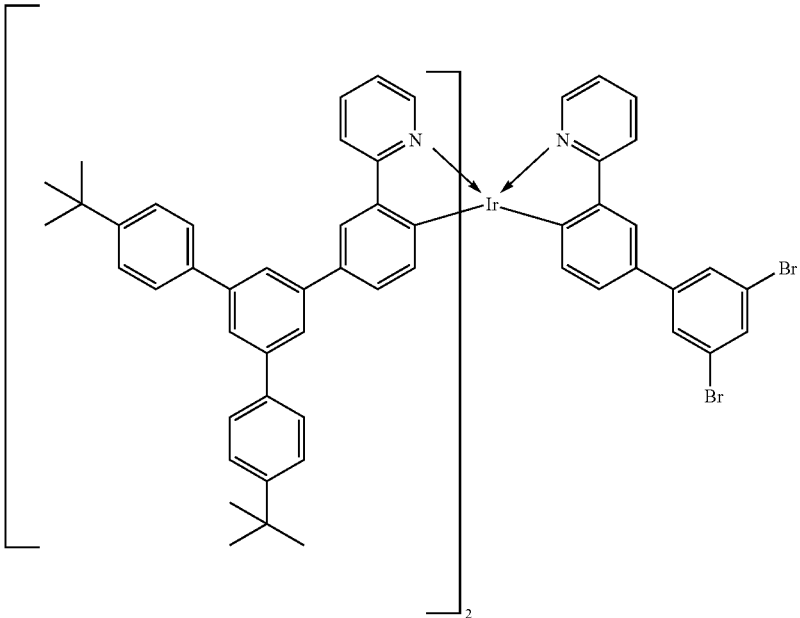 Comparative Monomer 1 | — | 4.68 |

Polymer Example 3 and Comparative Polymers 3A and 3B

Polymer Example 3, Comparative Polymer 3A and Comparative Polymer 3B were prepared by Suzuki polymerisation as described in WO 00/53656 of monomers set out in Table 3 to produce polymers having molecular weight distributions as set out in Table 4.

TABLE 3

Polymer Example 3 and Comparative Polymers 3A and 3B monomers composition

| Monomer | Polymer Example 3 (mol %) | Comparative Polymer 3A (mol %) | Comparative Polymer 3B (mol %) |
|---|---|---|---|
| 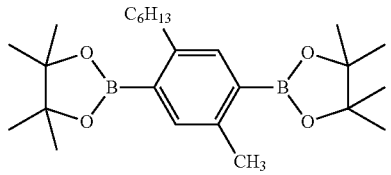 | 50 | 50 | 50 |

TABLE 3-continued
Polymer Example 3 and Comparative Polymers 3A and 3B monomers composition
| Monomer | Polymer Example 3 (mol %) | Comparative Polymer 3A (mol %) | Comparative Polymer 3B (mol %) |
|---|---|---|---|
| 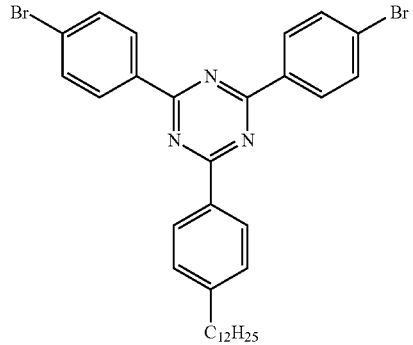 | 11.5 | 11.5 | 11.5 |
| 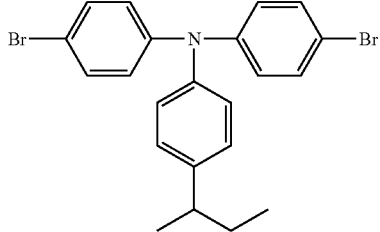 [SMILES: CCC(C)c1ccc(N(c2ccc(Br)cc2)c2ccc(Br)cc2)cc1] | 10 | 10 | 10 |
| 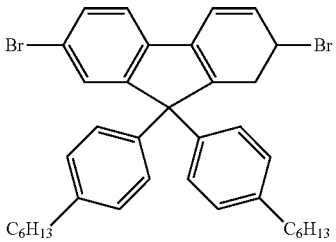 | 24.5 | 20.5 | 22.5 |
| 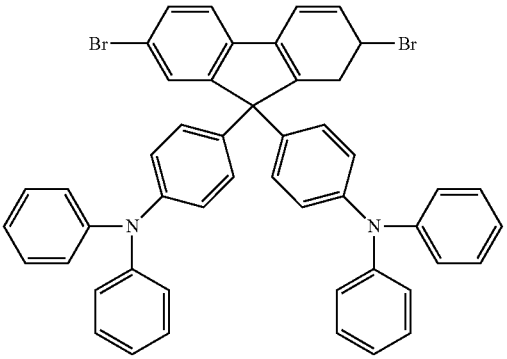 [SMILES: Brc1ccc2c(c1)C(c1ccc(N(c3ccccc3)c3ccccc3)cc1)(c1ccc(N(c3ccccc3)c3ccccc3)cc1)C1=C2C=CC(Br)C1] | — | — | 2 |

TABLE 3-continued

Polymer Example 3 and Comparative Polymers 3A and 3B monomers composition

| Monomer | Polymer Example 3 (mol %) | Comparative Polymer 3A (mol %) | Comparative Polymer 3B (mol %) |
|---|---|---|---|
| (dibromofluorene with two benzocyclobutane-terminated alkyl chains) | 10 | 10 | 10 |
| Monomer Example 1 | 4 | — | — |

TABLE 3-continued

Polymer Example 3 and Comparative Polymers 3A and 3B monomers composition

| Monomer | Polymer Example 3 (mol %) | Comparative Polymer 3A (mol %) | Comparative Polymer 3B (mol %) |
| --- | --- | --- | --- |
| 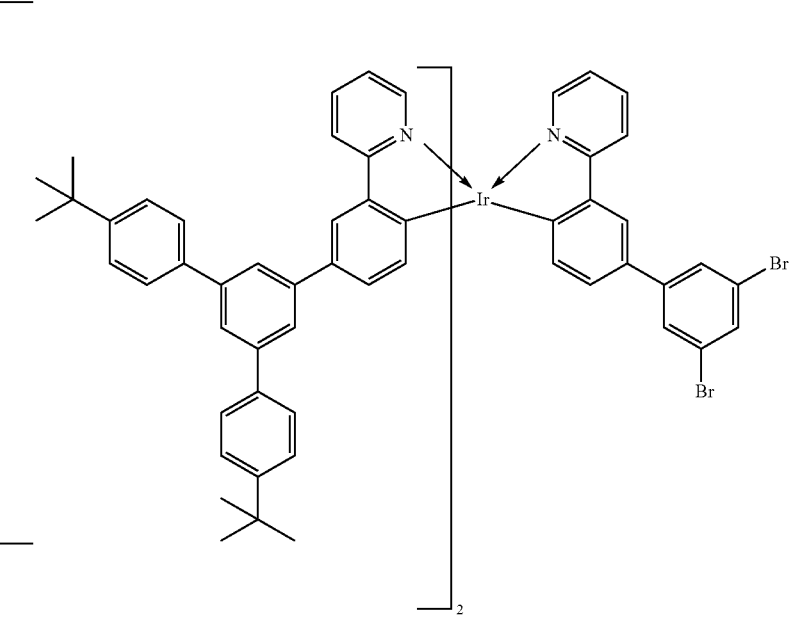  Comparative Monomer 1 | — | 4 | 4 |

TABLE 4

Polymer Example 3 and Comparative Polymers 3A and 3B molecular weights

| | Mz | Mw | Mp | Mn | PD |
| --- | --- | --- | --- | --- | --- |
| Polymer Example 3 | 476,000 | 260,000 | 223,000 | 89,000 | 2.92 |
| Comparative Polymer 3A | 1,324,000 | 672,000 | 607,000 | 143,000 | 4.72 |
| Comparative Polymer 3B | 2,241,000 | 1,064,000 | 861,000 | 184,000 | 5.78 |

Device Example 1

An organic light-emitting device having the following structure was formed on a glass substrate:

ITO/HIL (50 nm)/HTL1 (22 nm)/ELG (30 nm)/ELR (20 nm)/ELB (50 nm)/Cathode wherein ITO is an indium-tin oxide anode; HIL is a layer of hole-injection material available from Plextronics Inc., a HTL1 is a hole transporting layer; ELG is a light-emitting layer including a green phosphorescent light-emitting material; ELR is a red phosphorescent light-emitting layer; ELB is a blue fluorescent light-emitting layer; and Cathode is a cathode comprising a trilayer of a metal fluoride, aluminium and silver.

HIL, HTL1, ELG, ELR and ELB were each formed by spin-coating a solution comprising the components of that layer and a solvent, and evaporating the solvent. HTL1, ELG and ELR comprise crosslinkable groups that were crosslinked prior to spin-coating of the overlying layer.

HTL1 was formed by spin-coating Hole Transporting Polymer 1 formed by Suzuki polymerisation, as described in WO 00/53656, of the following monomers:

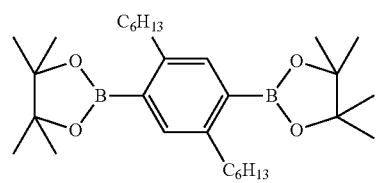

50 mol %

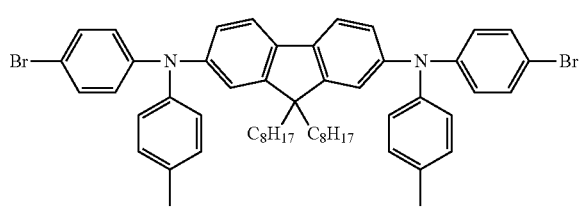

42.5 mol %

-continued

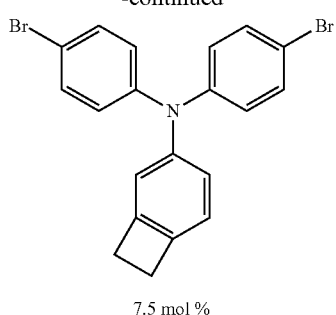

7.5 mol %

ELG was formed by spin-coating Polymer Example 1.

ELR was formed by spin-coating a 1:1 mixture by weight of Red Polymer 1 and Red Polymer 2.

Red Polymer 1 and Red Polymer 2 were each formed by Suzuki polymerisation, as described in WO 00/53656.

Red Polymer 1 and Red Polymer 2 were formed by polymerisation of monomers and a red phosphorescent end-capping unit in the molar percentages given below:

Red Polymer 1:

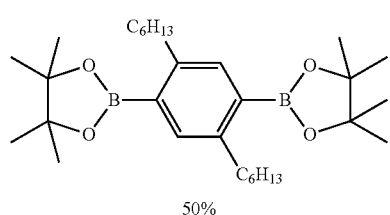

50%

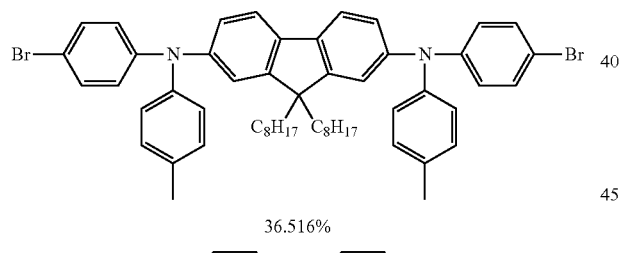

36.516%

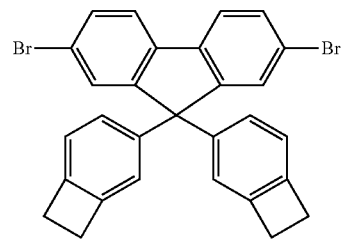

10%

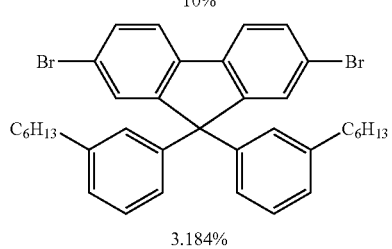

3.184%

-continued

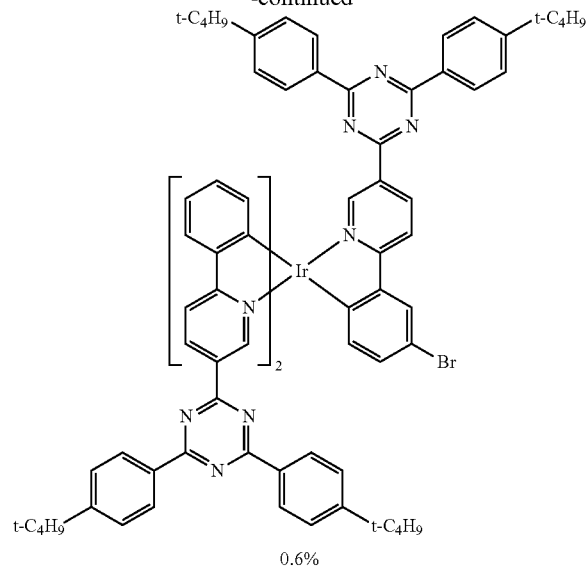

0.6%

Red Polymer 2:

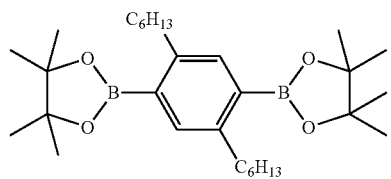

50%

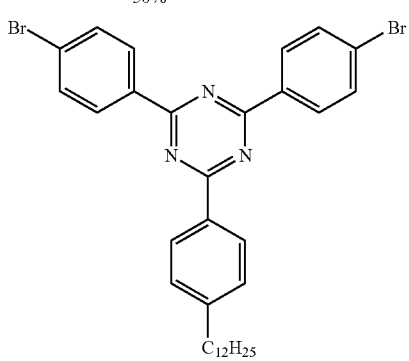

22%

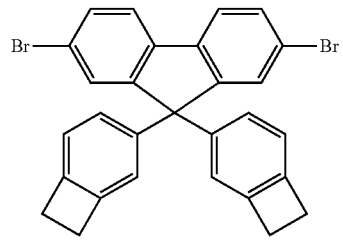

10%

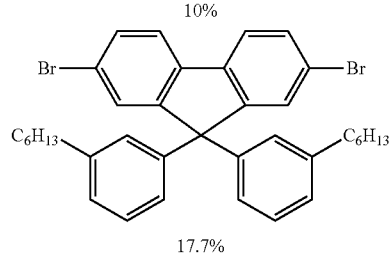

17.7%

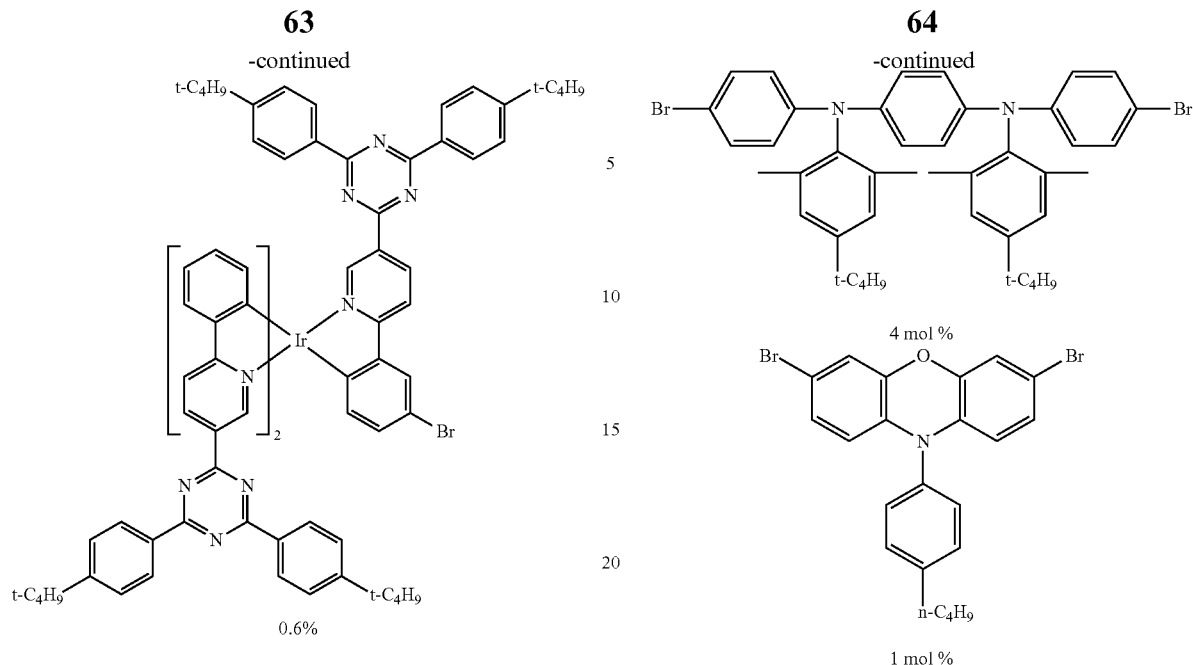

0.6%

ELB was formed by spin-coating Blue Polymer 1 formed by Suzuki polymerisation, as described in WO 00/53656, of monomers in the following molar percentages:

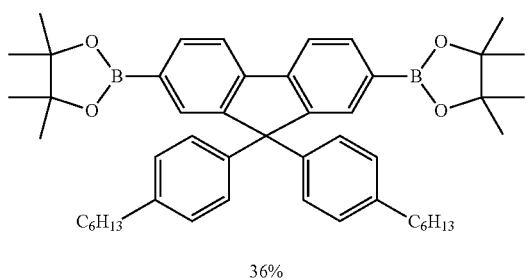

36%

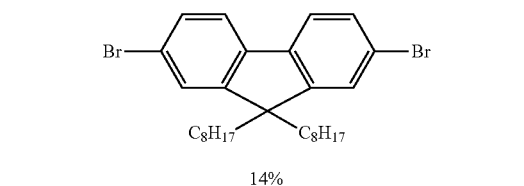

14%

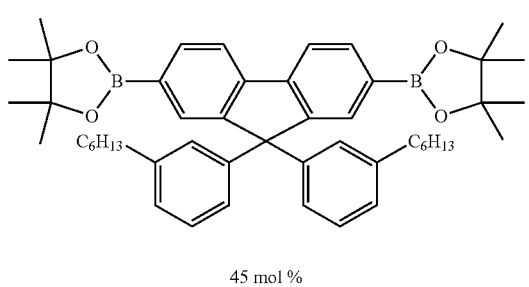

45 mol %

4 mol %

1 mol %

Comparative Device 1

A device was made as described with respect to Example 1 except that ELG was formed by spin-coating Comparative Polymer 1.

Device Example 2

An organic light-emitting device having the following structure was formed on a glass substrate:

ITO/HIL/HTL2/EL1/Cathode wherein ITO is an indium-tin oxide anode; HIL is a layer of hole-injection material available from Plextronics Inc., a HTL is a hole transporting layer; EL1 is a light-emitting layer; and Cathode is a cathode comprising a trilayer of a metal fluoride, aluminium and silver.

HIL, HTL2 and EL1 were each formed by spin-coating a solution comprising the components of that layer and a solvent, and evaporating the solvent. HTL comprises a crosslinkable group that was cross-linked prior to spin-coating of the overlying layer.

HTL2 was formed by spin-coating Hole Transporting Polymer 2 formed by Suzuki polymerisation, as described in WO 00/53656, of the following monomers:

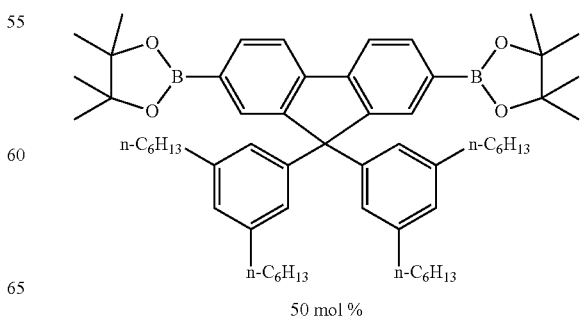

50 mol %

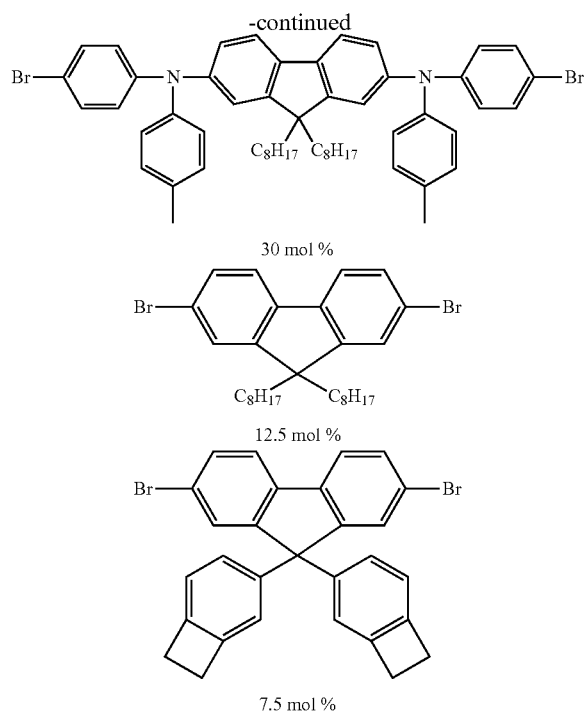

30 mol %

12.5 mol %

7.5 mol %

Comparative Device 2

A device was made as described with respect to Device Example 2 except that EL1 was formed by spin-coating Comparative Polymer 2.

Device Example 3

An organic light-emitting device having the following structure was formed on a glass substrate:

ITO/HIL (50 nm)/HTL3 (22 nm)/EL3/Cathode wherein ITO is an indium-tin oxide anode; HIL is a layer of hole-injection material; HTL3 is a hole transporting layer; EL3 is a light-emitting layer of Polymer Example 3; and Cathode is a cathode of a trilayer of a metal fluoride, aluminium and silver.

HIL, HTL3 and EL3 were each formed by spin-coating a solution comprising the components of that layer and a solvent, and evaporating the solvent. HTL3 comprises a crosslinkable group that was cross-linked prior to spin-coating of the overlying layer.

HTL3 was formed by spin-coating Hole Transporting Polymer 3 formed by Suzuki polymerisation, as described in WO 00/53656, and containing a dialkylphenylene repeat unit of formula (Xa); an amine repeat unit as described in WO 2005/049546; and fluorene repeat units of formula (IXa) substituted with crosslinkable groups.

Comparative Device 3A

A device was made as described with respect to Device Example 3 except that EL3 was formed by spin-coating Comparative Polymer 3A.

Comparative Device 3B

A device was made as described with respect to Device Example 3 except that EL3 was formed by spin-coating Comparative Polymer 3B.

Device Performance

With reference to Table 3 below, it can be seen that external quantum efficiency (EQE) is higher for Device Example 1 including the phosphorescent polymer of the invention compared to Comparative Device 1. Moreover, efficiency measured in lumens/Watt is increased by 2 lm/W and the colour rendering index (CRI) is improved for Device Example 1 when compared to Comparative Device 1.

TABLE 5

| | Device performance | | | | | |
|---|---|---|---|---|---|---|
| Device | CIE (x) | CIE (y) | EQE (%) | Efficiency (Lm/W) | Colour Rendering Index (CRI) | T70 lifetime (hours) |
| Comparative 1 | 0.474 | 0.429 | 12.8 | 21.6 | 68.8 | 282 |
| Example 1 | 0.476 | 0.432 | 13.7 | 23.7 | 71.7 | 488 |

Figure 2:
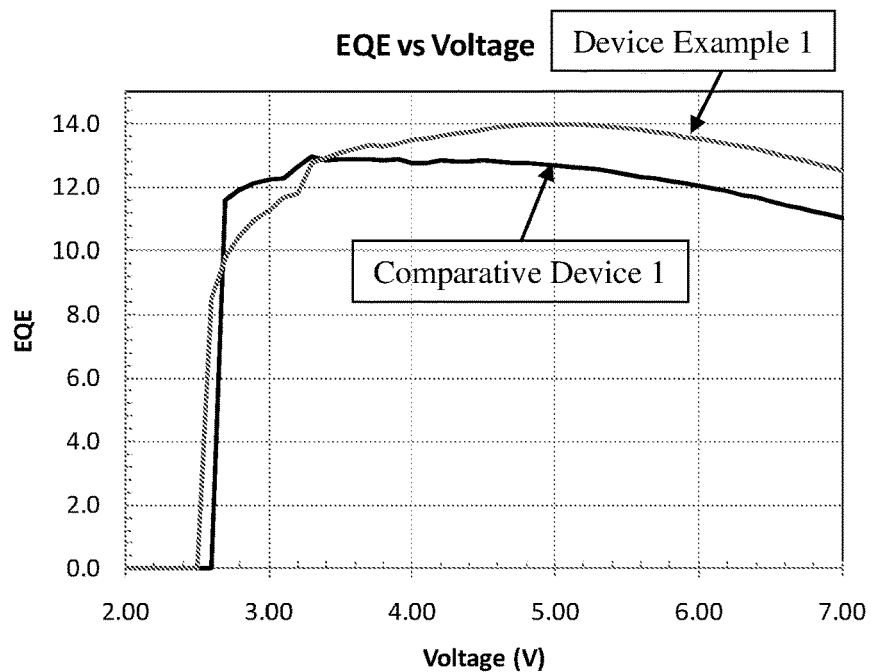
FIG. 2 shows the emission efficiencies, presented as EQE vs voltage graph, of a white light emitting device containing a material according to an embodiment of the invention and a device containing a comparative emitting material.

FIG. 2 shows that the use of the phosphorescent polymer according to the present invention gives an improved injection (EQE trace starts rising at lower voltage for Example 1 device than the one for Comparative Device 1).

Figure 3:
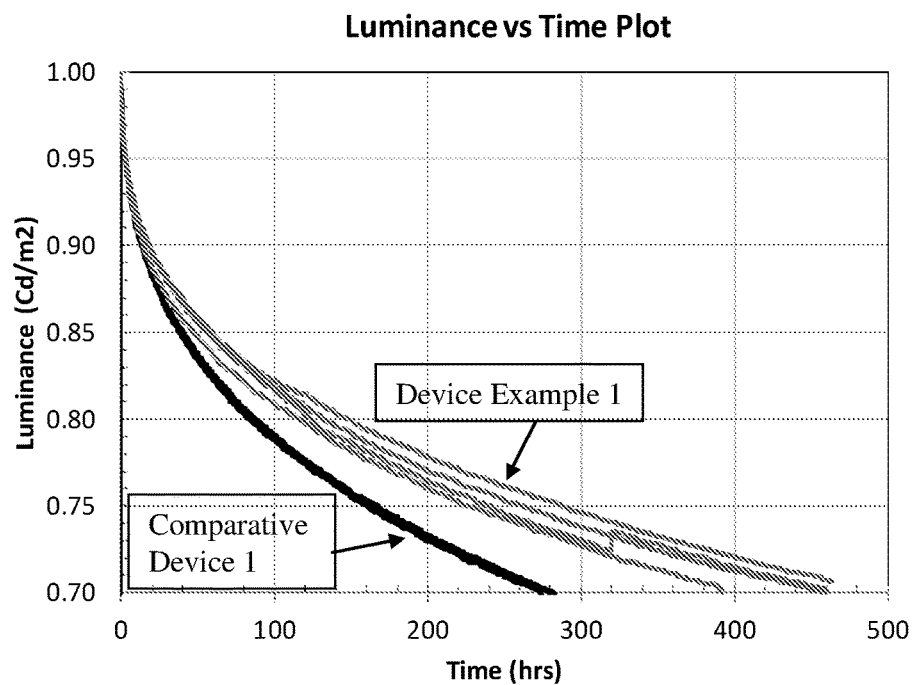
FIG. 3 shows plots of luminescence vs time for a white light emitting device containing a material according to an embodiment of the invention and a device containing a comparative emitting material.

FIG. 3 shows that the lifetime (T70) of the Example Device 1, that is the time taken for luminance of the device to decay to 70% of a starting brightness at constant current, is also improved to over 460 hours compared to 280 hours lifetime for Comparative Device 1 when tested at a starting luminance of 2000 cd/m$^2$.

Figure 4:
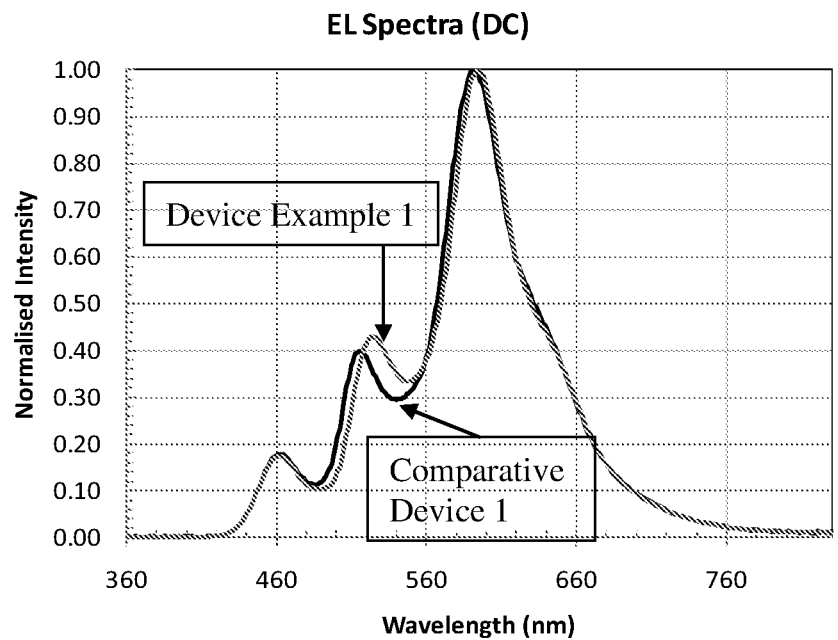
FIG. 4 shows the emission spectra of a white light emitting device containing a material according to an embodiment of the invention and a device containing a comparative emitting material.
Figure 5:
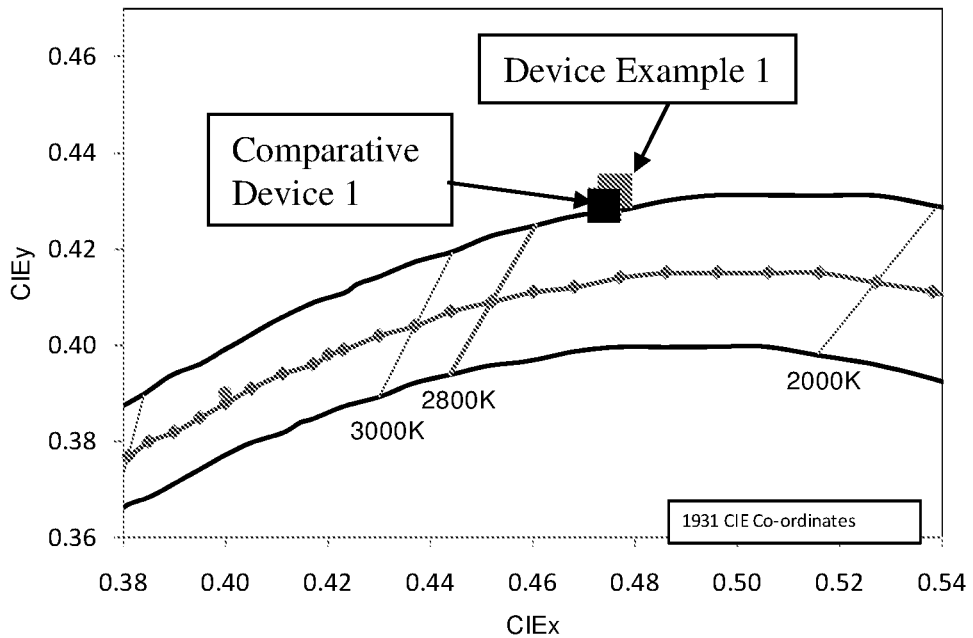
FIG. 5 shows a CIE chart of emission for a white light emitting device containing a material according to an embodiment of the invention and a device containing a comparative emitting material.

The photoluminescence spectra presented on FIG. 4 show a 10 nm shift of the central peak towards the yellow part of the spectrum for the polymer comprising Monomer Example 1 leading to an improved CRI when compared to Comparative Monomer 1. At the same time the CIE coordinates obtained for white emission from the example emitter and the comparative emitter are almost identical as shown in FIG. 5.

Without wishing to be bound by any theory, it is believed that the presence of amine substituents in the polymers of the present invention aids hole injection and hole mobility. This provides a further advantage in that the loading of iridium complex required in the polymer of the present invention can be reduced to 4% compared to 7.8% for the polymer of Comparative Emitter 1, which is advantageous when using an expensive metal such as iridium.

Figure 6:
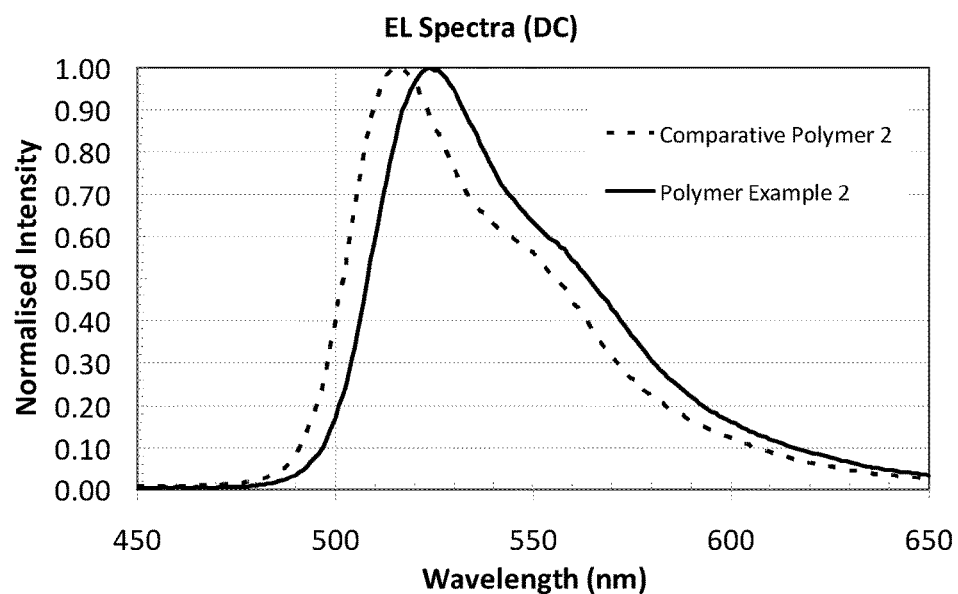
FIG. 6 shows the electroluminescent spectrum of a second device containing a material according to an embodiment of the invention in which substantially all emission from the device is from the material, and the spectrum of a comparative device.

FIG. 6 shows that Device Example 2 and Comparative Device 2 have similar electroluminescent spectra.

The drive voltage to reach a brightness of 1000 cd/m$^2$ for Comparative Device 2 was 4.85V, and 4.30V for Device Example 2.

Figure 7:
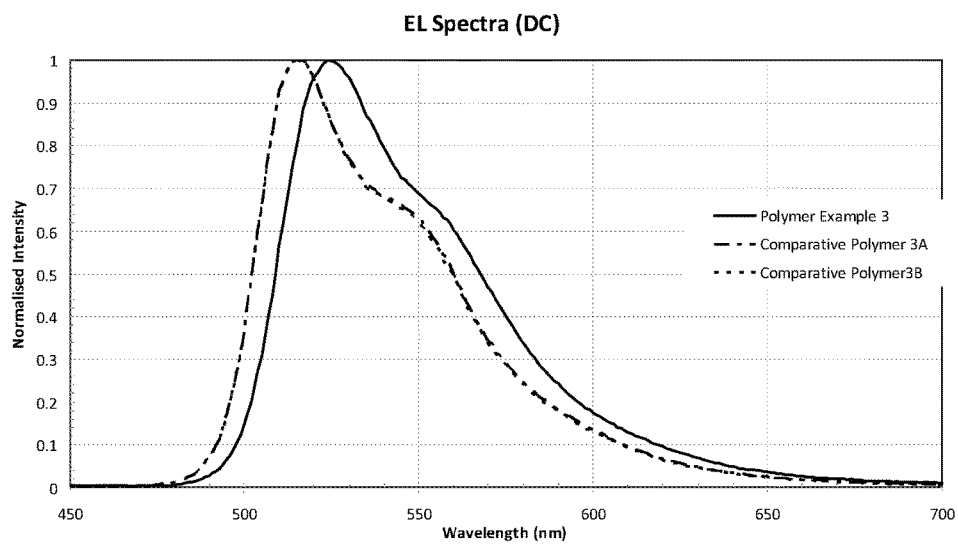
FIG. 7 shows the electroluminescent spectrum of a third device containing a material according to an embodiment of the invention in which substantially all emission from the device is from the material, and the spectra of two comparative devices.

With reference to FIG. 7, the electroluminescent spectrum for Device Example 3 is at a slightly longer wavelength than that of either Comparative Device 3A or 3B.

Figure 8:
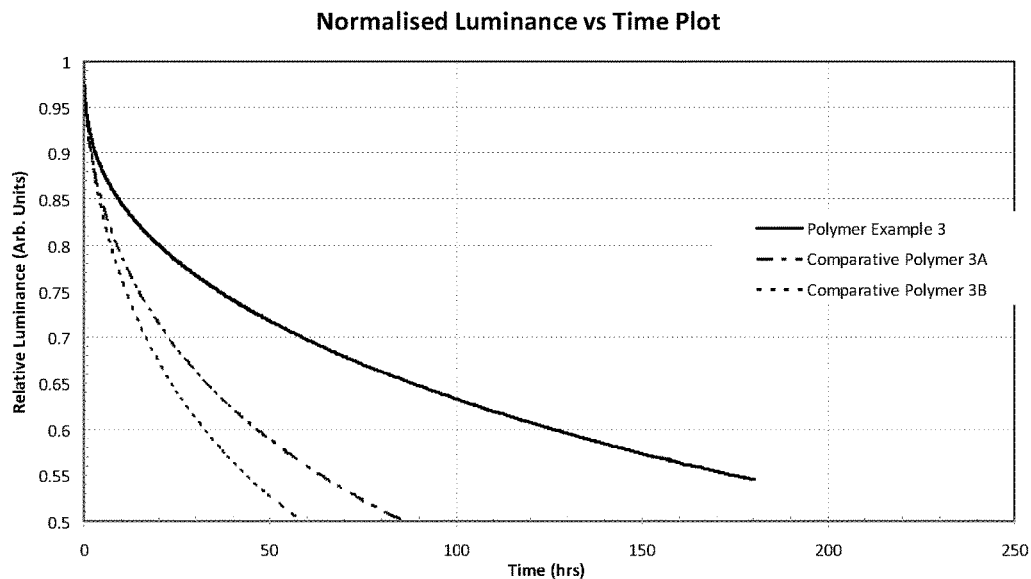
FIG. 8 shows plots of luminescence vs time for the third device and for comparative devices.

With reference to FIG. 8, the time taken for the brightness of Device Example 3 to fall to 50% of its original brightness is much longer for Device Example 3 than for either Comparative Device 3A or 3B.

Figure 9:
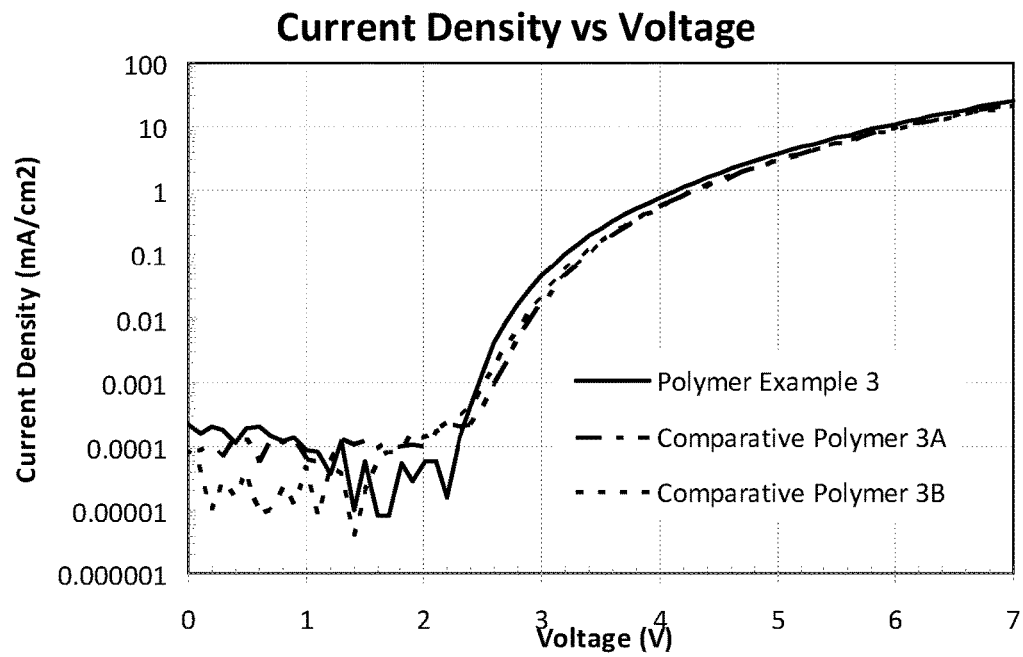
FIG. 9 shows plots of current density vs. voltage for the third device and for comparative devices.
Figure 10:
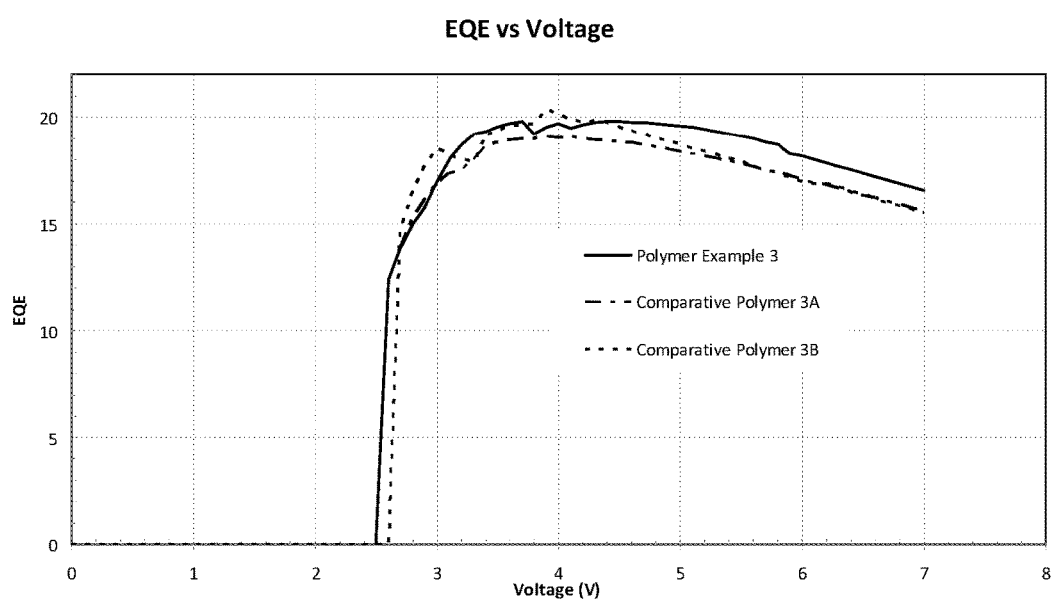
FIG. 10 shows plots of external quantum efficiency vs. voltage for the third device and for comparative devices

With reference to FIGS. 9 and 10, the current densities and external quantum efficiencies respectively of Device Example 3, Comparative Device 3A and Comparative Device 3B are similar.

Although the present invention has been described in terms of specific exemplary embodiments, it will be appreciated that various modifications, alterations and/or combinations of features disclosed herein will be apparent to those skilled in the art without departing from the scope of the invention as set forth in the following claims.

The invention claimed is:

1. A polymer comprising a repeat unit of formula (Ia):

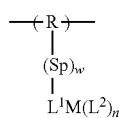
(Ia)

wherein:
M is a metal;
R is a backbone repeat group;
n is 1 or 2;
Sp is a spacer group;
w is 0 or 1;
$L^1$ is a mono- or bidentate coordinating group;
$L^2$ is a mono- or bidentate coordinating group and is the same or different in each occurrence;
---- represents a second metal to ligand bond in the case where $L^1$ or $L^2$ is a bidentate ligand; and
at least one of $L^1$ and $L^2$ is substituted with a group of formula (II):

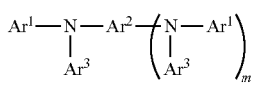
(II)

wherein:
m is 0 or 1;
each $Ar^1$, $Ar^2$, and $Ar^3$ is independently in each occurrence, an aryl or heteroaryl that is unsubstituted or substituted with one or more substituents; and
any two of $Ar^1$, $Ar^2$, and $Ar^3$ linked to the same N atom are optionally linked by a direct bond or a divalent linking group.

2. The polymer according to claim 1, wherein M is iridium.

3. The polymer according to claim 1, wherein:
R is $-(Ar^6)_p-$;
p is 1, 2, or 3; and
each $Ar^6$ is independently aryl or heteroaryl.

4. The polymer according to claim 3, wherein $Ar^6$ is phenyl that is unsubstituted or substituted with one or more substituents.

5. The polymer according to claim 4, wherein R is an unsubstituted or substituted repeat unit of formula:

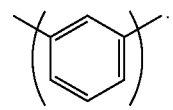

6. The polymer according to claim 1, wherein each $L^1$ and $L^2$ are independently ligands comprising a bidentate group of formula (III):

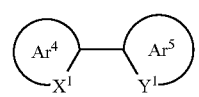
(III)

wherein $Ar^4$ and $Ar^5$ are the same or different; are optionally fused together; and are independently an aryl or heteroaryl that is unsubstituted or substituted with one or more substituents; and wherein $X^1$ and $Y^1$ are the same or different and are independently carbon or nitrogen.

7. The polymer according to claim 6, wherein said bidentate group is a 2-phenylpyridine group.

8. The polymer according to claim 1, wherein m is 1.

9. The polymer according to claim 1, wherein one of $Ar^1$, $Ar^2$, and $Ar^3$ is bound directly to $L^1$ or $L^2$.

10. The polymer according to claim 1, wherein w is 0.

11. The polymer according to claim 1, wherein Sp is selected from the group consisting of $C_{1-20}$ alkyl and phenyl-$C_{1-20}$ alkyl, and wherein one or more non adjacent C atoms of $C_{1-20}$ alkyl are optionally replaced with O, S, or COO.

12. The polymer according to claim 1, comprising a repeat unit of formula (IV) or (V), which is unsubstituted or substituted with one or more substituents:

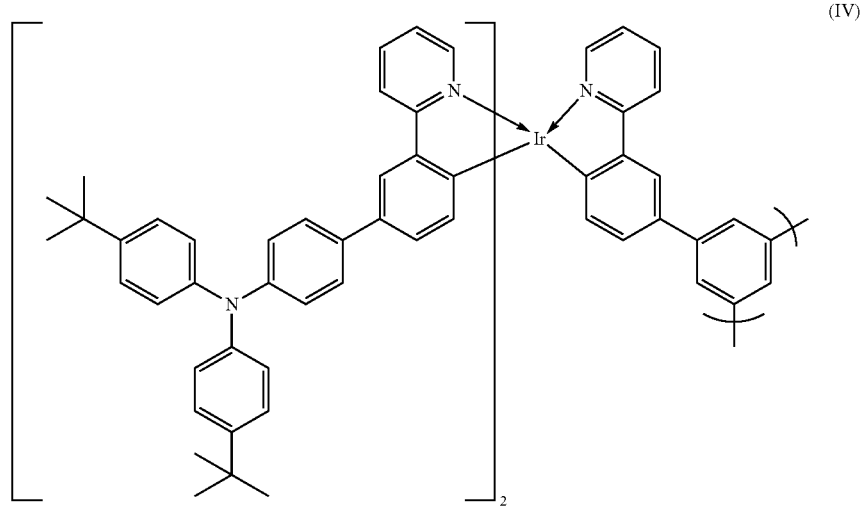
(IV)

-continued

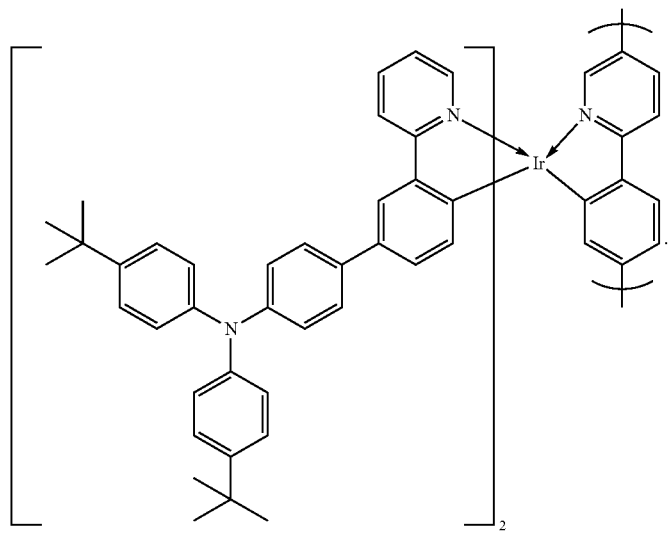

(V)

13. The polymer according to claim 1, wherein the polymer contains 0.5-40 mol of the repeat units of formula (Ia), (IV), or (V):

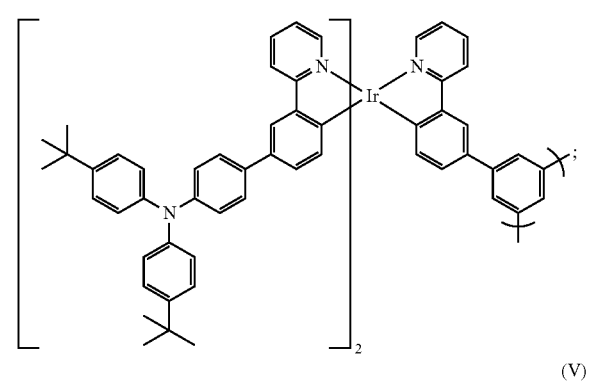

(IV)

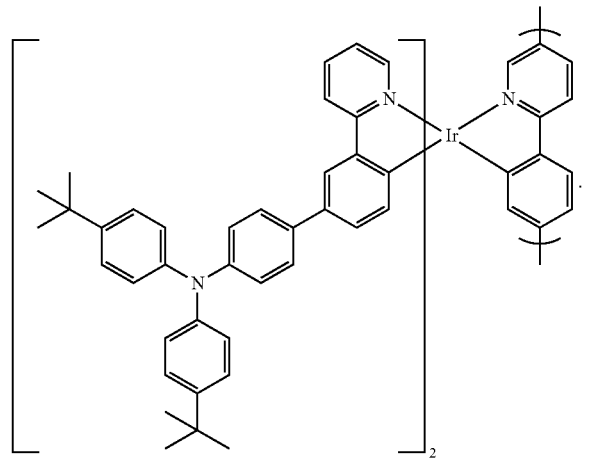

(V)

14. The polymer according to claim 1, wherein a photoluminescent spectrum of the polymer has a peak at a wavelength in the range 540-620 nm.

15. The polymer according to claim 1, comprising one or more co-repeat units.

16. The polymer according to claim 15, comprising an arylene co-repeat unit that is unsubstituted or substituted with one or more substituents.

17. A formulation comprising:

a polymer according to claim 1; and at least one solvent.

18. An organic light-emitting device comprising an anode, a cathode, and a light-emitting layer between the anode and the cathode, wherein the light-emitting layer comprises a polymer according to claim 1.

19. The organic light-emitting device according to claim 18, wherein the device is a white light emitting device.

20. A method of forming an organic light-emitting device comprising an anode, a cathode, and a light-emitting layer between the anode and the cathode, the method comprising the step of forming the light-emitting layer over one of the anode or cathode, and forming the other of the anode or cathode over the light-emitting layer, wherein the light-emitting layer is formed by depositing the formulation according to claim 17 and evaporating the at least one solvent.

21. The polymer according to claim 1, wherein M is iridium and the polymer comprises less than 7.8 mol % of the repeat unit of formula (Ia).

* * * * *

UNITED STATES PATENT AND TRADEMARK OFFICE
CERTIFICATE OF CORRECTION

PATENT NO. : 10,403,823 B2
APPLICATION NO. : 15/024986
DATED : September 3, 2019
INVENTOR(S) : Martin Humphries et al.

Page 1 of 1

It is certified that error appears in the above-identified patent and that said Letters Patent is hereby corrected as shown below:

In the Claims

At Column 69, Claim 13, Line 26, please add % after the word "mol".

Signed and Sealed this
Seventh Day of April, 2020

Andrei Iancu
*Director of the United States Patent and Trademark Office*